United States Patent
Noda

(10) Patent No.: US 7,321,505 B2
(45) Date of Patent: *Jan. 22, 2008

(54) NONVOLATILE MEMORY UTILIZING ASYMMETRIC CHARACTERISTICS OF HOT-CARRIER EFFECT

(75) Inventor: Kenji Noda, Fukuoka (JP)

(73) Assignee: NSCore, Inc., Fukuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/367,952

(22) Filed: Mar. 3, 2006

(65) Prior Publication Data

US 2007/0206413 A1 Sep. 6, 2007

(51) Int. Cl.
*G11C 11/00* (2006.01)

(52) U.S. Cl. .................................. 365/154; 365/185.08
(58) Field of Classification Search ............ 365/185.08
See application file for complete search history.

(56) References Cited

U.S. PATENT DOCUMENTS

| | | | |
|---|---|---|---|
| 3,636,530 A | 1/1972 | Mark et al. ................. | 365/228 |
| 4,419,744 A | 12/1983 | Rutter ......................... | 365/145 |
| 5,956,269 A | 9/1999 | Ouyang et al. ........ | 365/185.08 |
| 6,038,168 A | 3/2000 | Allen et al. ............ | 365/185.07 |
| 6,906,953 B2 | 6/2005 | Forbes ................... | 365/185.03 |
| 6,906,962 B2 | 6/2005 | Layman et al. ......... | 365/189.01 |
| 6,909,635 B2 | 6/2005 | Forbes et al. ................ | 365/174 |
| 6,996,000 B2 * | 2/2006 | Chen et al. .................. | 365/154 |
| 7,193,888 B2 * | 3/2007 | Horiuchi ..................... | 365/154 |
| 7,206,217 B2 * | 4/2007 | Ohtsuka et al. ............. | 365/154 |
| 2004/0208044 A1 * | 10/2004 | Lin et al. ..................... | 365/145 |
| 2005/0073876 A1 * | 4/2005 | Chen et al. .................. | 365/154 |

FOREIGN PATENT DOCUMENTS

| | | |
|---|---|---|
| JP | 6-76582 | 3/1994 |
| WO | 2004/057621 A1 | 7/2004 |

* cited by examiner

*Primary Examiner*—Tan T. Nguyen
(74) *Attorney, Agent, or Firm*—Ladas & Parry, LLP

(57) ABSTRACT

A memory circuit includes a latch having a first node and a second node, a first MIS transistor having source/drain nodes thereof coupled to the first node and to a plate line, respectively, and a gate node thereof coupled to a word selecting line, a second MIS transistor having source/drain nodes thereof coupled to the second node and to the plate line, respectively, and a gate node thereof coupled to the word selecting line, and a driver circuit configured to set the plate line to a first potential causing the first node to serve as a source node of the first MIS transistor in a first operation mode and to a second potential causing the first node to serve as a drain node of the first MIS transistor in a second operation mode, the first operation mode causing a lingering change in characteristics of the first MIS transistor.

16 Claims, 21 Drawing Sheets

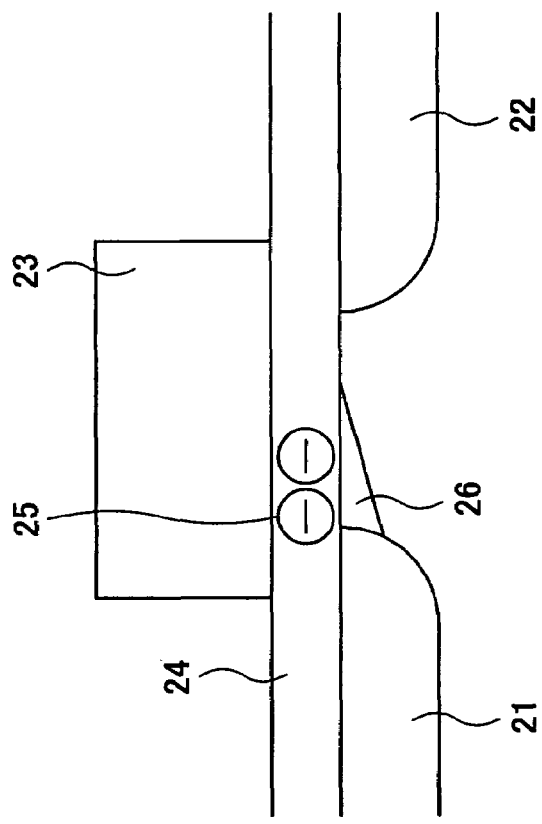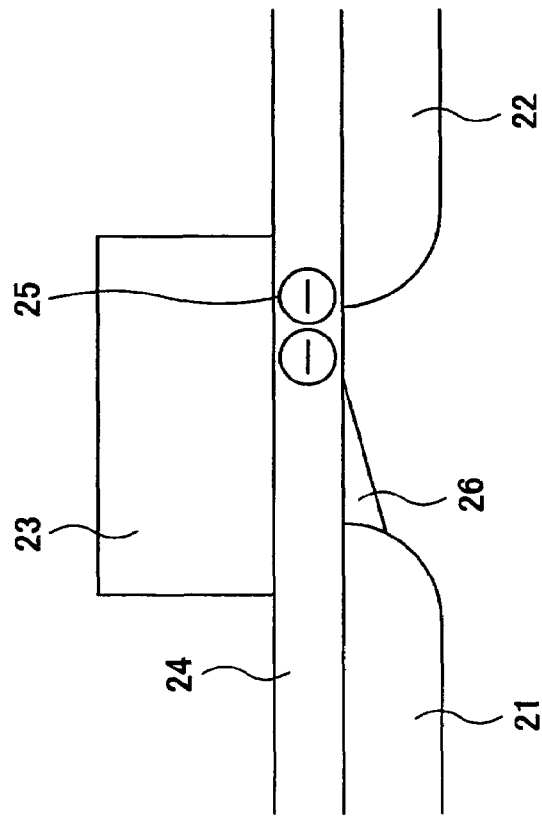

FIG.8

|         | PL | RESTORE | WLW   | EQ    | WL | WE |
|---------|----|---------|-------|-------|----|----|
| WRITE   | 0  | 1       | 1     | 0     | 1  | 1  |
| READ    | 0  | 1       | 1     | 0     | 1  | 0  |
| STORE   | 1  | 1       | 1     | 0     | 0  | 0  |
| RESTORE | 0  | 0-0-1   | 0-1-0 | 0-1-1 | 0  | 0  |
| STANDBY | 0  | 1       | 1     | 0     | 0  | 0  |

FIG.16

|  | RESTORE | STORE | RECALL | WLW | EQ | WL | WE |
|---|---|---|---|---|---|---|---|
| WRITE | 1 | 1 | 1 | 0 | 1 | 1 | 1 |
| READ | 1 | 1 | 1 | 0 | 1 | 1 | 0 |
| STORE | 1 | 0 | 0 | 1 | 1 | 0 | 0 |
| RESTORE | 0-0-1 | 1 | 1 | 0-1-1 | 0-1-1 | 0 | 0 |
| STANDBY | 1 | 0 | 1 | 0 | 1 | 0 | 0 |

NONVOLATILE MEMORY UTILIZING ASYMMETRIC CHARACTERISTICS OF HOT-CARRIER EFFECT

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, include flash EEPROMs employing a floating gate structure, FeRAMs employing a ferroelectric film, MRAMs employing a ferromagnetic film, etc.

In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such transistor having a special structure and the need for such film made of a special material are one of the factors that result in an increase in the manufacturing costs.

PCT/JP2003/016143, which was filed on Dec. 17, 2003, the entire contents of which are hereby incorporated by reference, discloses a nonvolatile memory cell (i.e., a basic unit of data storage) comprised of a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience an irreversible hot-carrier effect on purpose for storage of one-bit data. A difference in the transistor characteristics caused by the hot-carrier effect represents one-bit data "0" or "1".

Specifically, when one of the two transistors is subjected to a hot-carrier effect, a difference in the ON current develops between the two transistors. The difference in the ON current may be detected by a one-bit static memory circuit (latch) coupled to the transistor pair.

A hot-carrier effect is asymmetric with respect to the source and drain relation of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are swapped and used as a drain node and a source node, respectively, at the time of detecting a drain current, the detected drain current exhibits a significant drop caused by the hot-carrier effect. The difference in the detected drain current between these two scenarios is approximately a factor of 10.

Such asymmetric characteristic of a hot-carrier effect, when properly used, may serve to enhance the data write speed of the nonvolatile semiconductor memory device utilizing a hot-carrier effect.

SUMMARY OF THE INVENTION

It is a general object of the present invention to provide a nonvolatile semiconductor memory device that substantially obviates one or more problems caused by the limitations and disadvantages of the related art.

It is another and more specific object of the present invention to provide a hot-carrier-effect-based nonvolatile semiconductor memory device that utilizes the asymmetric characteristic of a hot-carrier effect for the purpose of enhancing data-write speed.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a memory circuit which includes a latch including MIS transistors, the latch having a first node and a second node configured to be bi-stable with a potential of the first node inverse to a potential of the second node, a plate line, a word selecting line, a first MIS transistor having one of source/drain nodes thereof coupled to the first node of the latch, another one of the source/drain nodes thereof coupled to the plate line, and a gate node thereof coupled to the word selecting line, a second MIS transistor having one of source/drain nodes thereof coupled to the second node of the latch, another one of the source/drain nodes thereof coupled to the plate line, and a gate node thereof coupled to the word selecting line, and a driver circuit configured to set the plate line to a first potential causing the first node to serve as a source node of the first MIS transistor in a first operation mode and to a second potential causing the first node to serve as a drain node of the first MIS transistor in a second operation mode, the first operation mode causing a lingering change in characteristics of the first MIS transistor. All of the MIS transistors, the first MIS transistor, and the second MIS transistor may have a substantially identical thickness of a gate insulating film.

According to another aspect of the present invention, a semiconductor memory device includes a control circuit, word lines extending from the control circuit, controlled-power lines controlled by the control circuit, word selecting lines extending from the control circuit, and a plurality of memory units arranged in a matrix, one of the memory units coupled to a first bit line and a second bit line. The one of the memory units includes a latch including MIS transistors, the latch having a first node and a second node configured to be bi-stable with a potential of the first node inverse to a potential of the second node, a first MIS transistor having one of source/drain nodes thereof coupled to the first node of the latch, another one of the source/drain nodes thereof coupled to one of the controlled-power lines, and a gate node thereof coupled to one of the word selecting lines, a second MIS transistor having one of source/drain nodes thereof coupled to the second node of the latch, another one of the source/drain nodes thereof coupled to the one of the controlled-power lines, and a gate node thereof coupled to the one of the word selecting lines, a third transistor having a gate thereof coupled to one of the word lines and source/drain nodes thereof coupled to the first node and the first bit line, respectively, and a fourth transistor having a gate thereof coupled to the one of the word lines and source/drain nodes thereof coupled to the second node and the second bit line, respectively. Further, the control circuit is configured to set the one of the controlled-power lines to a first potential causing the first node to serve as a source node of the first MIS transistor in a first operation mode and to a second potential causing the first node to serve as a drain node of the first MIS transistor in a second operation mode, the first operation mode causing a lingering change in characteristics of the first MIS transistor. All of the MIS transistors, the first MIS transistor, and said second MIS transistor may have a substantially identical thickness of a gate insulating film.

According to at least one embodiment of the present invention, with the swapping of the source and drain nodes for the data read operation (second operation mode) relative to the data write operation (first operation mode), a change in the transistor characteristics caused by a hot-carrier effect is efficiently used as a means to store data. Further, since the first and second nodes of the latch are used as source nodes during the write operation (first operation mode), the potential that causes a hot-carrier effect is not applied to the transistors constituting the latch. With this arrangement, it is possible to avoid causing a hot-carrier effect to the transistors used in the latch circuit, and, thus, these transistors do not have to be designed to have a thicker gate oxide film that ensures hot-carrier-effect-free transistor operations even at high potentials. All the MIS transistors used in the memory cell (i.e., the MIS transistors serving as memory cell transistors and the MIS transistors constituting the latch circuit) may thus be properly designed to have the same structure with the same thickness of the gate oxide film.

BRIEF DESCRIPTION OF THE DRAWINGS

Other objects and further features of the present invention will be apparent from the following detailed description when read in conjunction with the accompanying drawings, in which:

FIGS. 2A and 2B are illustrative drawings for explaining localization of a hot-carrier effect;

FIG. 8 is a table chart showing the signal levels of control signals that are defined with respect to each operation;

FIG. 16 is a table chart showing the signal levels of control signals that are defined with respect to each operation;

DESCRIPTION OF THE PREFERRED EMBODIMENTS

In the following, embodiments of the present invention will be described with reference to the accompanying drawings.

In the present invention, a memory cell includes a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve a nonvolatile data retention. Which one of the MIS transistors has a strong lingering change determines whether the stored data is "0" or "1".

In the present invention, a drain node and a source node used to apply a bias for generating the hot-carrier effect are swapped and used as a source node and a drain node, respectively, at the time of reading the data. With the swapping of the source and drain nodes at the time of data read operation relative to the time of data write operation, a change in the transistor characteristics caused by the hot-carrier effect is efficiently used as a means to store data.

Further, the present invention utilizes a latch (flip-flop) circuit to determine data to be stored in the memory-cell MIS transistors. The latch circuit is also used to read (sense) the data stored in the memory-cell MIS transistors. The latch circuit and the memory-cell MIS transistors together constitute a memory cell (memory circuit) according to the invention.

A circuit provided to control the memory cell is configured such that a high potential is not applied to the latch circuit when this high potential is applied to the memory-cell MIS transistors to cause a hot-carrier effect. With this arrangement, the present invention avoids causing a hot-carrier effect to the transistors used in the latch circuit, and, thus, these transistors do not have to be designed to have a thicker gate oxide film that ensures hot-carrier-effect-free transistor operations even at high potentials. All the MIS transistors used in the memory cell (i.e., the MIS transistors serving as memory cell transistors and the MIS transistors constituting the latch circuit) may thus be properly designed to have the same structure with the same thickness of the gate oxide film. The present invention, however, is not limited to such identical thickness configuration, and each transistor may be designed to have its own thickness according to design requirements.

Figure 1:
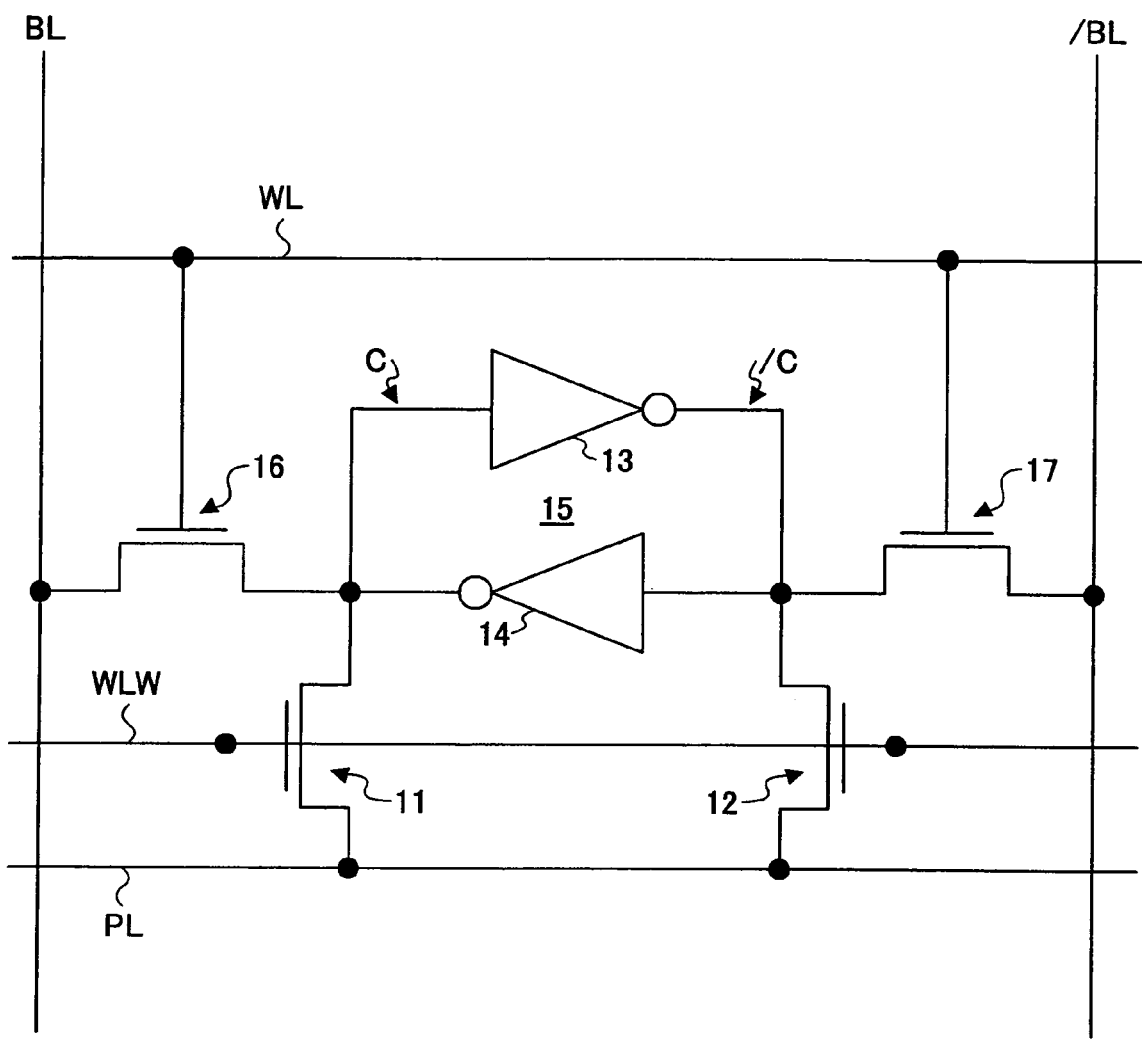
FIG. 1 is a circuit diagram showing an example of the configuration of a nonvolatile semiconductor memory circuit according to the present invention.

FIG. 1 is a circuit diagram showing an example of the configuration of a nonvolatile semiconductor memory circuit according to the present invention. In FIG. 1, the nonvolatile memory cell according to the present invention is comprised of n-channel silicon MOS transistors as a non-limiting example. Other transistors such as p-channel silicon MOS transistors may as well be used to form the nonvolatile memory cell according to the present invention.

A memory cell (i.e., a basic unit of data storage) shown in FIG. 1 includes an NMOS transistor 11, an NMOS transistor 12, and inverters 13 and 14. The memory cell 10 is coupled to surrounding circuit elements, which include bit lines BL and /BL, a word line WL, and NMOS transistors 16 and 17.

The gate node of the NMOS transistor 11 and the gate node of the NMOS transistor 12 are coupled to a word selecting line WLW. One of the source/drain nodes of the NMOS transistor 11 is coupled to a plate line (controlled-power line) PL, and the other is coupled to an electrical node C. One of the source/drain nodes of the NMOS transistor 12 is coupled to the plate line PL, and the other is coupled to an electrical node /C (the symbol "/" preceding another symbol indicates an inverse of the latter symbol).

Each of the inverters 13 and 14 has the output thereof coupled to the input of one another, thereby forming a latch circuit (flip-flop circuit) 15. The electrical node C and electrical node /C of the latch circuit 15 have respective bi-stable potentials that are inverse to each other.

The NMOS transistor 16 provides a coupling between the electrical node C and the bit line BL. The NMOS transistor 17 provides a coupling between the electrical node /C and the bit line /BL. With this provision, it is possible to control the inputting/outputting of data into/from the latch circuit 15 through the NMOS transistors 16 and 17.

When the word line WL is activated to HIGH, the NMOS transistors 16 and 17 become conductive. The data stored in the latch circuit 15 is thus read to the bit lines BL and /BL. If the bit lines BL and /BL are externally forced to respective potentials, on the other hand, the data represented by the bit line potentials is stored in the latch circuit 15 through the NMOS transistors 16 and 17.

The NMOS transistor 11 and NMOS transistor 12 are conventional MIS (metal-insulating film-semiconductor) transistors, which are substantially the same as the MIS transistors used in the inverters 13 and 14. The NMOS transistor 11 and NMOS transistor 12 are designed such as to operate with a power supply voltage of 1.8 V, for example. Namely, when these transistors are driven with a voltage no greater than 1.8 V, a change in the characteristics due to a hot-carrier effect does not occur from a practical point of view.

The electrical nodes C and /C of the latch circuit 15 are set to respective potentials that are inverse to each other. For example, the electrical node C may be set to 0 V, and the electrical node /C may be set to 1.8 V.

After the electrical nodes C and /C are set to the respective potentials as described above, the potential of the plate line PL is set to 3.3 V, for example. Further, the potential of the word selecting line WLW is set to 1.65 V, for example. The potential of the word selecting line WLW is determined such as to maximize the effect of a hot-carrier phenomenon. Generally, such potential is selected to be half the voltage between the source node and drain node of the transistor that is subjected to a hot-carrier effect.

When the potentials are set as described above, a voltage of 3.3 V between the plate line PL and the electrical node C is applied between the drain node and source node of the NMOS transistor 11. Further, a voltage of 1.65 V between the word selecting line WLW and the electrical node C is applied between the gate node and source node of the NMOS transistor 11.

Since these bias voltages are larger than the voltages used in routine operations, the NMOS transistor 11 experiences a strong hot-carrier effect. Specifically, the application of the bias voltages for duration of 0.1 second to 1 second serves to generate a change in the characteristics that is substantially larger than the normal variation of the transistor characteristics. For example, the threshold voltage of the NMOS transistor 11 rises a few tens of millivolts. In other words, the channel resistance decreases approximately by 10%.

It should be noted that such a change in the transistor characteristics caused by a hot-carrier effect is localized around the drain node of the NMOS transistor 11, i.e., around the node of the NMOS transistor 11 that is coupled to the electrical node C.

In the example described above, only the NMOS transistor 11 experiences a hot-carrier effect. The NMOS transistor 12 does not experience a hot-carrier effect because a voltage across its drain node and source node is only 1.5 V, which is within the range of voltages used in routine operations.

If the potentials of the electrical nodes C and /C are reversed, with C being set to 1.8 V and /C being set to 0 V, the NMOS transistor 11 having 1.5 V applied between the drain node and source node thereof does not experience a hot-carrier effect. There is thus no lingering change in the transistor characteristics of the NMOS transistor 11. On the other hand, the NMOS transistor 12 experiences a hot-carrier effect.

The hot-carrier effect as described above leaves an irreversible lingering change in the transistor characteristics. Changes in the characteristics of the NMOS transistor 11 and NMOS transistor 12 caused by the hot-carrier effect thus achieve a nonvolatile data retention that reflects the initial potential settings of the electrical nodes C and /C.

During the operation to store nonvolatile data as described above, the high potential (3.3V) is never applied to the inverters 13 and 14. This is because the NMOS transistors 11 and 12 serve as intervening circuit elements between the plate line (3.3 V) and the nodes C and /C. Since the word selecting line WLW is set to 1.65 V, and the nodes C and C/ are serving as source nodes, the potentials at the nodes C and /C cannot exceed 1.65 V minus the threshold voltage.

In this configuration, therefore, a hot-carrier effect does not happen in the transistors used in the latch circuit. All the MIS transistors used in the memory cell (i.e., the MIS transistors 11 and 12 serving as memory cell transistors and the MIS transistors constituting the latch circuit) can thus be properly designed to have the same structure with the same thickness of the gate oxide film.

In order to read the data from the NMOS transistor 11 and the NMOS transistor 12, the latch circuit 15 comprised the inverters 13 and 14 is initially placed in an electrically inactive state, and is then shifted to an electrically active state. This may be achieved by shifting the power supply voltage VDD applied to the inverters 13 and 14 from 0 V to 1.8 V. The potentials of the word selecting line WLW and the plate line PL are set to 1.8 V and 0 V, respectively, before the latch circuit 15 is activated.

In a first case, the NMOS transistor 11 has a lingering change in the characteristics due to a hot-carrier effect (such as an increase in the threshold voltage or a decrease in the ON current), whereas the NMOS transistor 12 does not have such a lingering change in the characteristics. In this case, the force that pulls down the electrical node C is weaker than the force that pulls down the electrical node /C. After the activation of the latch circuit 15, therefore, the electrical node C is set to the HIGH level, and the electrical node /C is set to the LOW level.

In a second case, the NMOS transistor 12 has a lingering change in the characteristics due to a hot-carrier effect (such as an increase in the threshold voltage or a decrease in the ON current), whereas the NMOS transistor 11 does not have such a lingering change in the characteristics. In this case, the force that pulls down the electrical node C is stronger than the force that pulls down the electrical node /C. After the activation of the latch circuit 15, therefore, the electrical node C is set to the HIGH level, and the electrical node /C is set to the LOW level.

In this manner, the configuration shown in FIG. 1 can detect and sense the data stored through a hot-carrier effect. It should be noted, however, that the HIGH/LOW levels of the electrical nodes C and /C are reversed between when the data is written and when the data is read. Because of this, there is a need to invert the data at the time of data writing or at the time of data reading.

FIGS. 2A and 2B are illustrative drawings for explaining localization of a hot-carrier effect.

FIG. 2A illustrates accumulation of electric charge at the time of data writing. FIG. 2A shows a source node 21, a drain node 22, a gate node 23, a gate insulating film 24, accumulated electric charge 25, and a channel 26. At the time of data wiring, the drain node 22 is set to HIGH, and the source node 21 is set to LOW. The electric field in the channel 26 becomes stronger towards the drain node 22, and a larger number of hot carriers are generated near the drain node 22 than near the source node 21. Because of this, the accumulation of electric charge in the gate insulating film 24 mainly occurs in the proximity of the drain node 22. The position of the accumulated electric charge 25 illustrates such localized accumulation.

FIG. 2B illustrates the position of the channel 26 at the time of data reading. When the source node and drain node are swapped after the time of data writing, the accumulated electric charge 25 is situated near the source node 21. The closer the accumulated electric charge 25 to the source node 21, the stronger the effect of the accumulated electric charge 25 is at the time of data reading.

Figure 3:
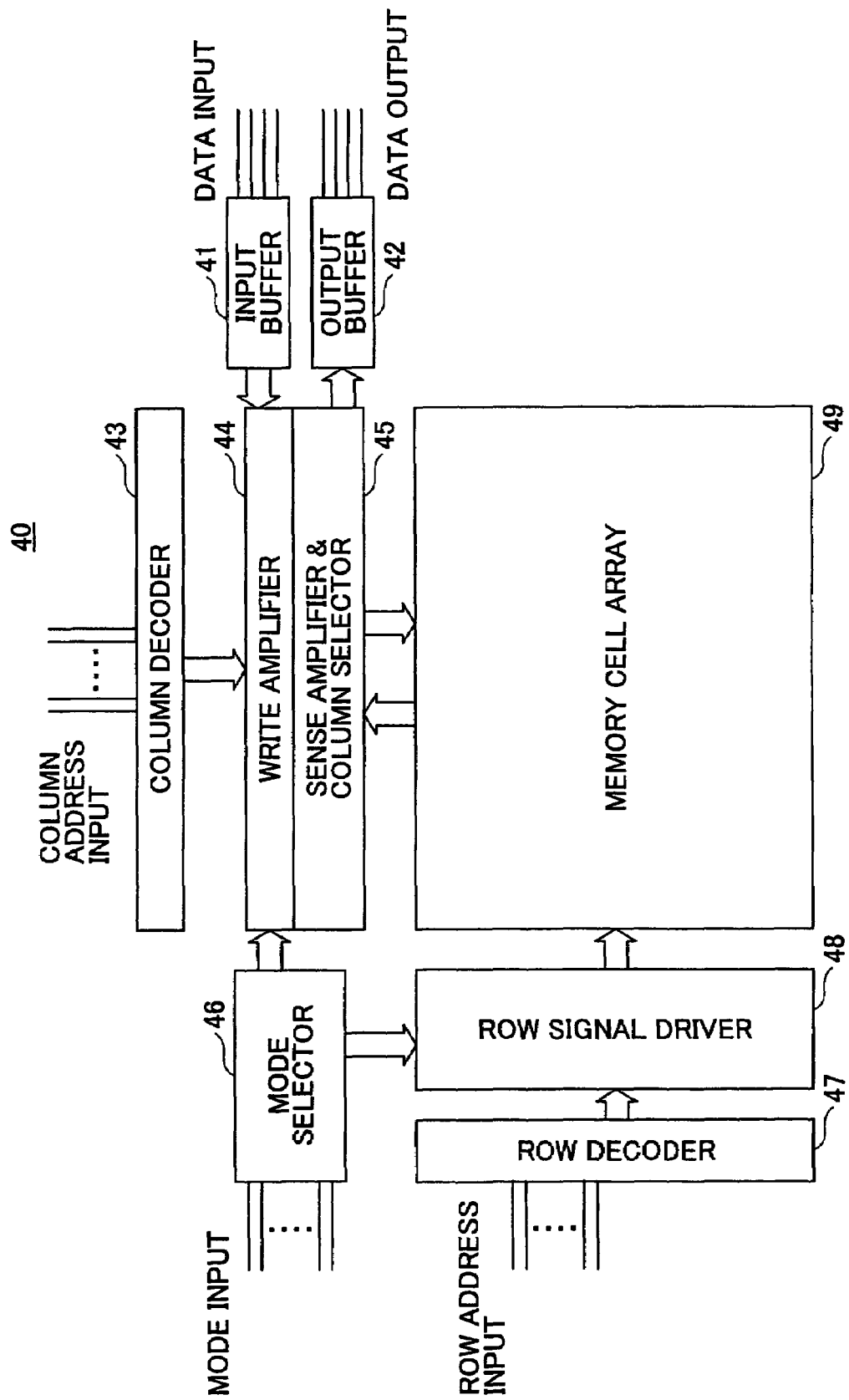
FIG. 3 is a block diagram showing the configuration of a nonvolatile semiconductor memory device according to the present invention.

FIG. 3 is a block diagram showing the configuration of a nonvolatile semiconductor memory device according to the present invention. A semiconductor memory device 40 shown in FIG. 3 includes an input buffer 41, an output buffer 42, a column decoder 43, a write amplifier 44, a sense amplifier & column selector 45, a mode selector 46, a row decoder 47, a row signal driver 48, and a memory cell array 49.

The memory cell array 49 includes a plurality of memory cells arranged in a matrix form, each memory cell having a circuit configuration as will later be described. The memory cells arranged in the same column are connected to the same bit lines, and the memory cells arranged in the same row are connected to the same word line.

The mode selector 46 receives mode input signals from an exterior of the device, and decodes the mode input signal to determine an operation mode (e.g., a write operation mode or a read operation mode). Control signals responsive to the determined operation mode are supplied to the write amplifier 44, the sense amplifier & column selector 45, the row signal driver 48, etc., for control of the individual parts of the semiconductor memory device 40.

The column decoder 43 receives a column address input from the exterior of the device, and decodes the column address input to determine a selected column. The decode signals indicative of the selected column are supplied to the write amplifier 44 and the sense amplifier & column selector 45.

The row decoder 47 receives a row address input from the exterior of the device, and decodes the row address input to determine a selected row. The decode signals indicative of the selected row are supplied to the row signal driver 48.

In response to the control signals from the mode selector 46 and the decode signals from the row decoder 47, the row signal driver 48 activates a selected word line among the word lines extending from the row signal driver 48. As a result of the activation of the selected word line, a volatile memory unit (such as the latch circuit 15 of FIG. 1) is coupled to a corresponding bit line pair among a plurality of bit line pairs. Through this coupling, the writing/reading of data to/from the volatile memory portion is performed.

In response to the control signals from the mode selector 46 and the decode signals from the column decoder 43, the sense amplifier & column selector 45 couples bit lines corresponding to the selected column to a data bus. Through this coupling, data is transferred between the memory cell array 49 and the data bus. The sense amplifier & column selector 45 amplifies the data read from the memory cell array 49 for provision to the output buffer 42. The data is output from the output buffer 42 to the exterior of the device as output data. Input data supplied to the input buffer 41 is provided to the write amplifier 44. The write amplifier 44 amplifies the input data to be written to the memory cell array 49.

Figure 4:
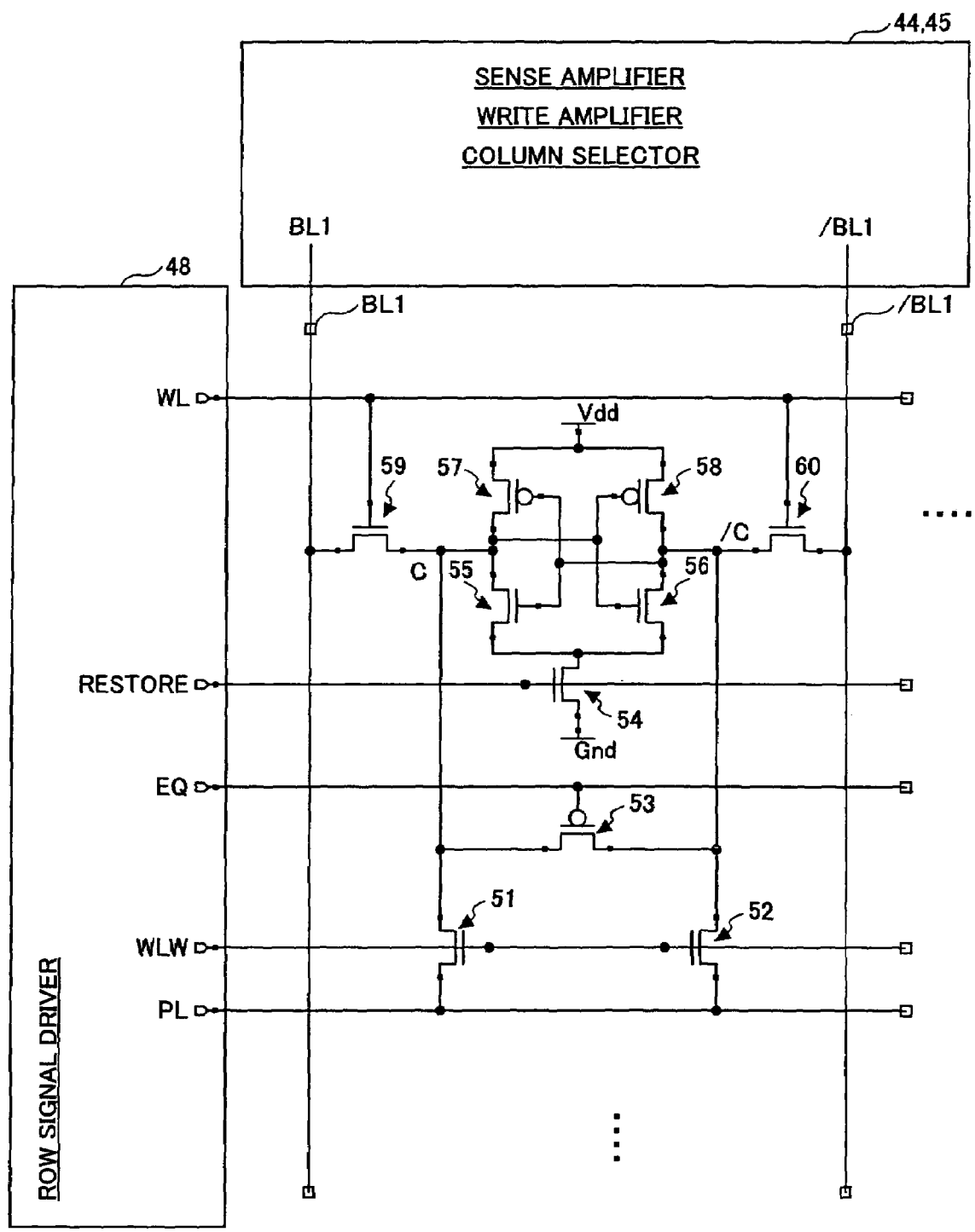
FIG. 4 is an illustrative drawing showing the configuration of a memory cell according to a first embodiment of the nonvolatile memory device of the present invention.

FIG. 4 is an illustrative drawing showing the configuration of a memory cell according to a first embodiment of the nonvolatile memory device of the present invention.

The memory cell includes NMOS transistors 51 and 52, a PMOS transistor 53, NMOS transistors 54 through 56, PMOS transistors 57 and 58, and NMOS transistors 59 and 60. The NMOS transistors 54 and 56 and PMOS transistors 57 and 58 together constitute a volatile memory unit, which corresponds to the latch circuit 15 of the memory cell shown in FIG. 1. The NMOS transistors 51 and 52 correspond to the NMOS transistors 11 and 12 shown in FIG. 1, constituting a nonvolatile memory unit.

The NMOS transistors 11 and 12 serving as nonvolatile memory cell transistors have the same structure as the other NMOS transistors including the NMOS transistors 54 through 56 used in the volatile memory unit and the NMOS transistors 59 and 60 used as a transfer gate between the memory cell and the bit lines. Further, it is preferable to manufacture all the MOS transistors of the memory cell with the same thickness of the gate oxide film. Namely, all the MOS transistors shown in FIG. 4 may be designed to operate with the same operating voltage (e.g., 1.8 V).

As shown in FIG. 4, bit lines BL1 and /BL1 extend from the write amplifier 44 and the sense amplifier & column selector 45, and are coupled to the volatile memory unit via the NMOS transistors 59 and 60 serving as a data transfer unit. A word selecting line WLW extends from the row signal driver 48, and is coupled to the gate nodes of the NMOS transistors 51 and 52 serving as the nonvolatile memory unit. A word line WL extends from the row signal driver 48 to be connected to the gates of the NMOS transistors 59 and 60. Further, a restore line RESTORE, plate line (controlled-power line) PL, and equalize line EQ also extend from the row signal driver 48.

It should be noted that the configuration shown in FIG. 4 is identical with respect to each and every one of the memory cells provided in the memory cell array 49. Namely, multiple sets of the lines RESTORE, PL, WLW, EQ, and WL are provided in one-to-one correspondence to the rows of the memory cell array 49.

Figure 5:
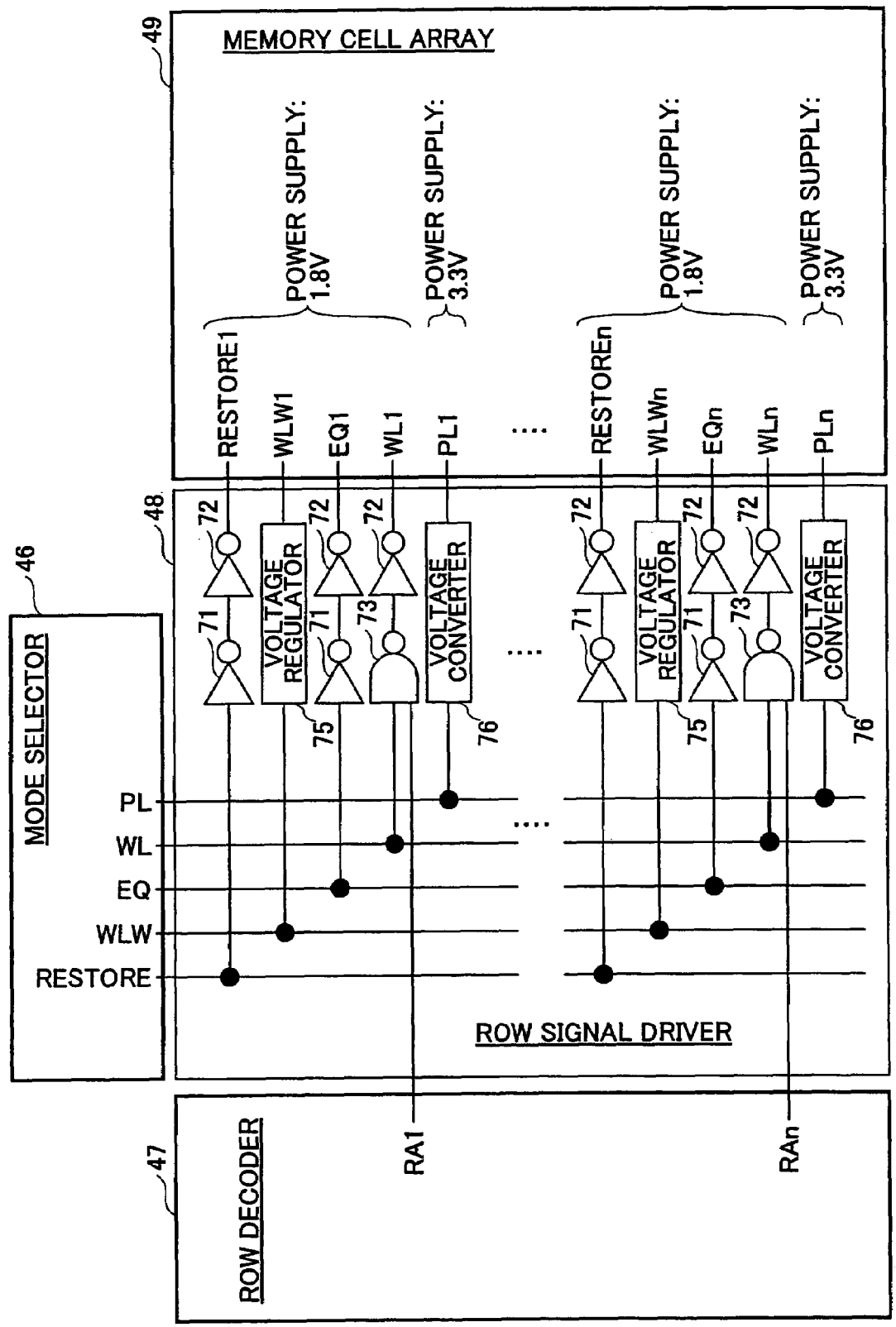
FIG. 5 is a drawing showing multiple sets of lines extending from a row signal driver and their relations with a mode selector and a row decoder.

FIG. 5 is a drawing showing the multiple sets of the lines extending from the row signal driver 48 and their relations with the mode selector 46 and the row decoder 47. In this configuration, store operation (storing data from the volatile memory unit to the nonvolatile memory unit) and restore operation (reading data from the nonvolatile memory unit to the volatile memory unit) are performed with respect to the entirety of the memory cell array 49, rather than performed on a row-address-specific basis. Read/write operations of the volatile memory unit with respect to the bit lines BL1 and /BL1 are of course performed on a row-address-specific basis.

As shown in FIG. 5, the mode selector 46 supplies signals RESTORE, WLW, EQ, WL, and PL to the row signal driver 48. The signals RESTORE, WLW, EQ, and PL are coupled to the corresponding lines of each row without any logic operation, and are thus output from the row signal driver 48 to the memory cell array 49 as RESTORE1, WLW1, EQ1, and PL1 for a row address RA1 and RESTOREn, WLWn, EQn, and PLn for a row address RAn, for example. Inverters 71 and 72 are used as output buffers for RESTORE and EQ. Voltage regulators 75 are used for WLW, and voltage converters 76 are used for PL. The voltage regulators 75 serve to regulate the voltage of the signal WLWx (x=1, . . . , n) applied to the gates of the NMOS transistors 51 and 52 (see FIG. 4). The voltage converters 76 serve to covert the voltage of the signal PL to the voltage of the signal PLx (x=1, . . . , n).

The signal WL supplied from the mode selector 46 and each row address signal are combined by a corresponding NAND gate 73, an output of which is inverted by the inverter 72 for provision to the memory cell array 49. Thus, only one of the signals WL1 through WLn is activated and supplied to the memory cell array 49 so as to activate a selected row address.

In this configuration, as described above, the store operation and restore operation are performed with respect to the entirety of the memory cell array 49. Alternatively, the store operation and restore operation may be performed separately for each row address. In such a case, the signals RESTORE, WLW, EQ, and PL supplied from the mode selector 46 are combined with each row address signal in the row signal driver 48 such as to achieve a proper row-address-specific store operation and restore operation.

Figure 6:
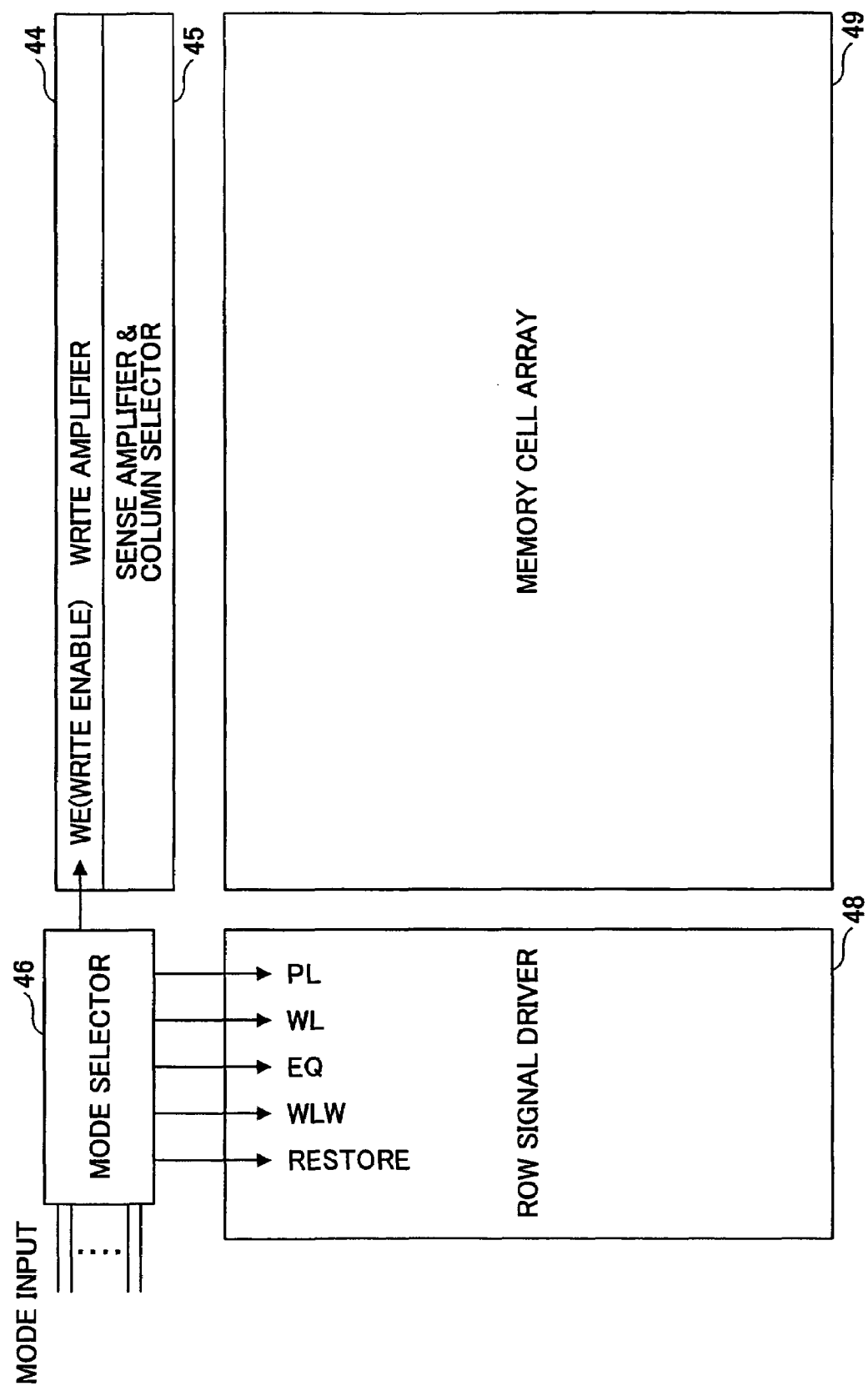
FIG. 6 is a drawing showing the flow of control signals output from the mode selector.

FIG. 6 is a drawing showing the flow of control signals output from the mode selector 46. As shown in FIG. 6, the mode selector 46 receives and decodes the mode input signals, and supplies various control signals to the row signal driver 48 and the write amplifier 44. Specifically, the control signals RESTORE, WLW, EQ, WL, and PL are supplied to the row signal driver 48, and a write enable signal WE is supplied to the write amplifier 44.

Figure 7:
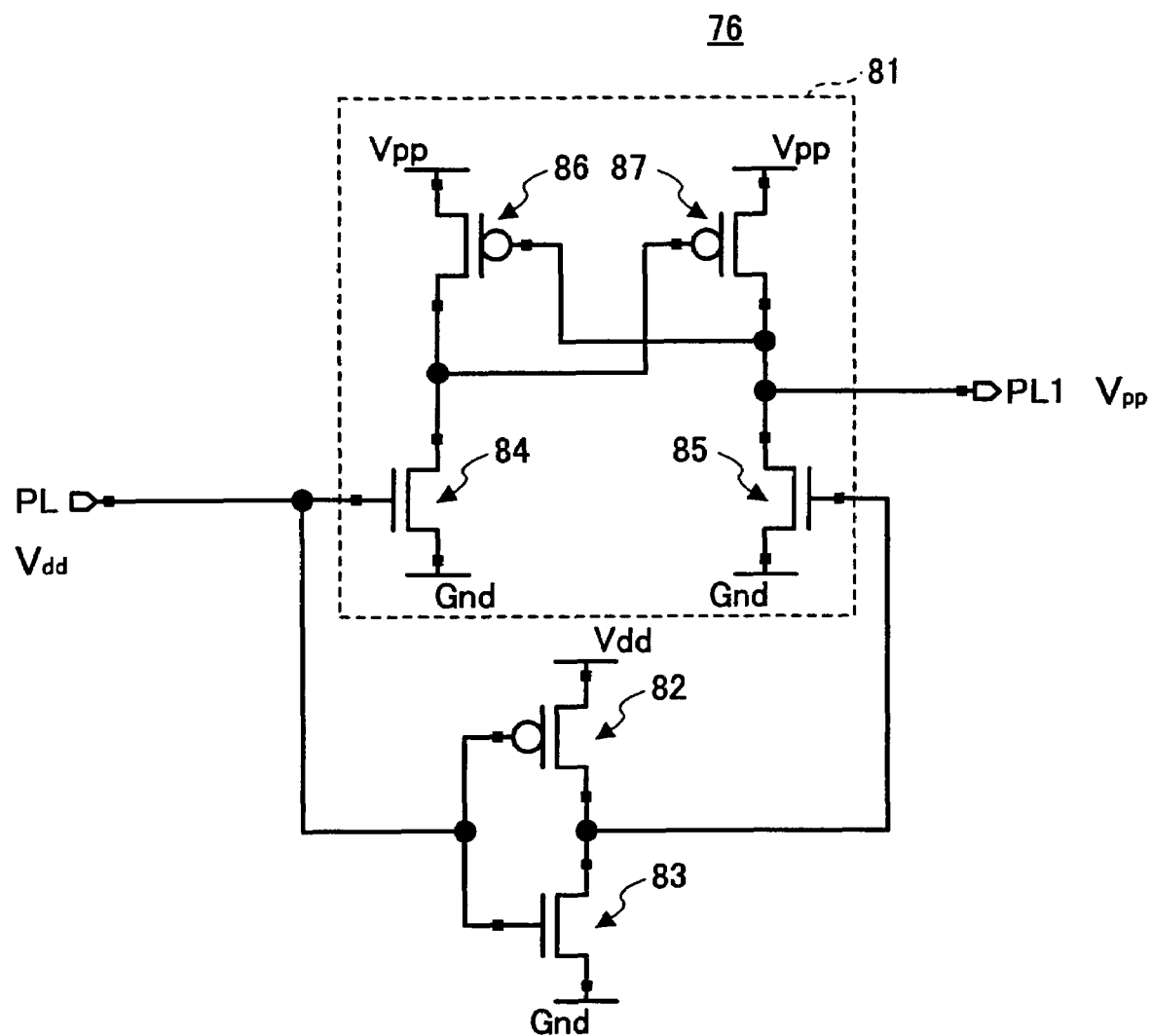
FIG. 7 is a circuit diagram showing an example of the circuit configuration of a voltage converter.

FIG. 7 is a circuit diagram showing an example of the circuit configuration of a voltage converter 76.

The voltage converter 76 shown in FIG. 7 includes a voltage shift circuit 81 and an inverter comprised of a PMOS transistor 82 and an NMOS transistor 83. The voltage shift circuit 81 includes NMOS transistors 84 and 85 and PMOS transistors 86 and 87.

When the signal PL input into the voltage converter 76 is HIGH (equal to Vdd), the NMOS transistors 84 and 85 are turned on and off, respectively, and the PMOS transistor 87 becomes conductive. As a result, the signal PL1 output from the voltage converter 76 has the potential thereof equal to Vpp. When the signal PL input into the voltage converter 76 is LOW (equal to 0 V), the NMOS transistors 84 and 85 are turned off and on, respectively, and the PMOS transistor 87 becomes nonconductive. As a result, the signal PL1 output from the voltage converter 76 has the potential thereof equal to 0 V.

With the use of the voltage converters 76 as described above, the row signal driver 48 can apply the high voltage (Vpp) to the plate line PL (see FIG. 4) at the time of store operation.

FIG. 8 is a table chart showing the signal levels of the control signals that are defined with respect to each operation. The columns of the table correspond to the respective control signals PL, RESTORE, WLW, EQ, WL, and WE, which are generated by the mode selector 46 in response to the mode input signals supplied from an exterior of the device. The rows of the table correspond to respective operations "Write", "Read", "Store", "Restore", and "Standby".

"Write" refers to the operation that writes data to the volatile memory unit. "Read" refers to the operation that reads data from the volatile memory unit. "Store" refers to the operation that writes data from the volatile memory unit to the nonvolatile memory unit. "Restore" refers to the operation that reads data from the nonvolatile memory unit to the volatile memory unit. "Standby" refers to the state in which data is maintained in the volatile memory unit.

The mode selector 46 sets the control signals to signal levels (signal states) as shown in the table of FIG. 8 in response to the mode input signals. Through such settings of the control signals, the mode selector 46 controls the write amplifier 44 and the row signal driver 48 to perform a requested operation with respect to the memory cell array 49.

Figure 9:
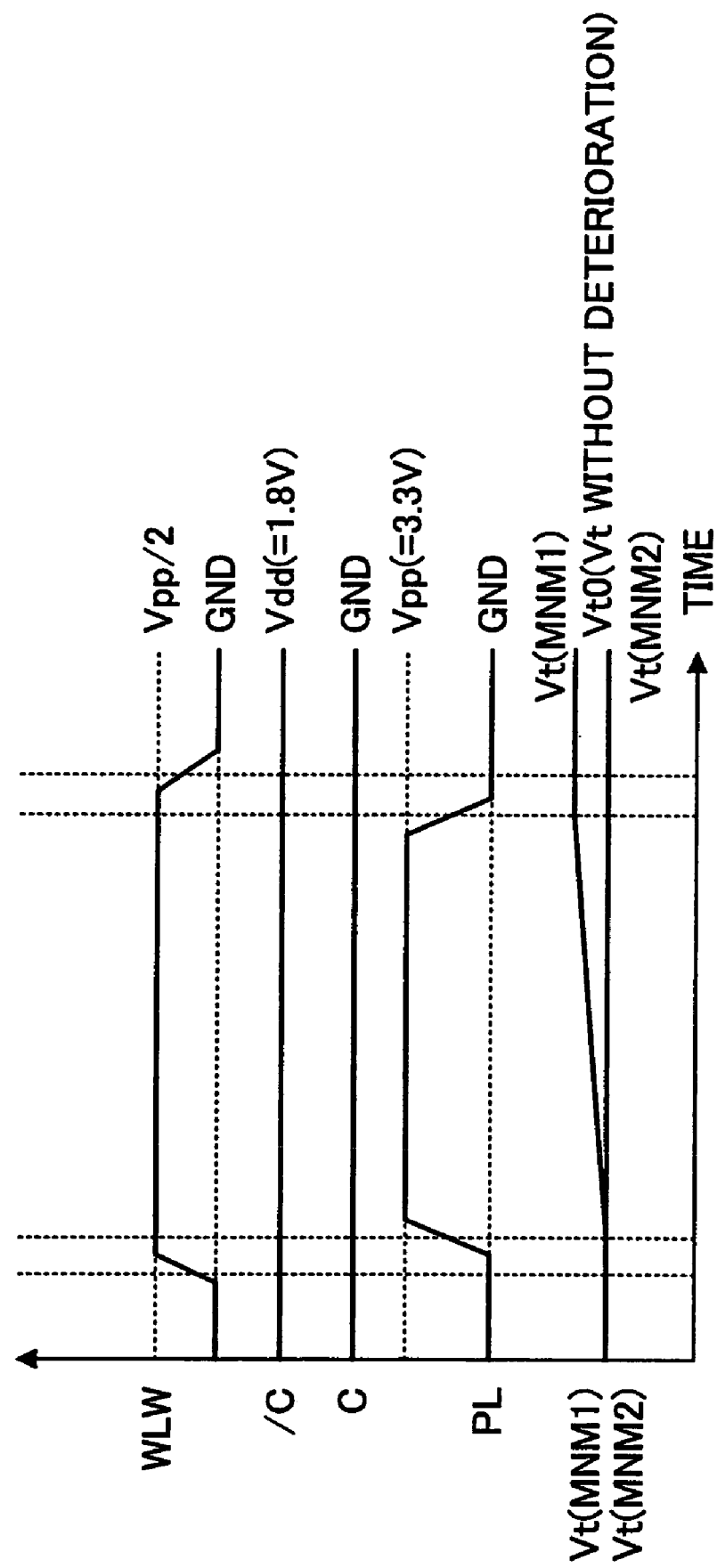
FIG. 9 is a signal waveform diagram for explaining the store operation of the nonvolatile memory device of the present invention.

FIG. 9 is a signal waveform diagram for explaining the store operation of the nonvolatile memory device of the present invention. When the mode input from the exterior of the device indicates a store operation, the control signals PL, RESTORE, WLW, EQ, WL, and WE are set to 1, 1, 1, 0, 0, and 0, respectively, as shown in FIG. 8. In response to PL being 1, the plate line PL is set to Vpp (=3.3 V), and in response to WLW being 1, the word selecting line WLW is set to Vpp/2, as shown in FIG. 9.

The potentials of the node C and the node /C are inverse to each other, and the data stored in the latch circuit (NMOS transistors 55 and 56 and PMOS transistors 57 and 58) determines which one of the nodes C and /C is HIGH.

In an example shown in FIG. 9, the node /C is HIGH (Vdd=1.8 V), and the node C is LOW (GND: ground). As a result, only the NMOS transistor 51 (denoted as MNM1 in FIG. 9) experiences a rise in the threshold voltage Vt. The NMOS transistor 52 (denoted as MNM2 in FIG. 9) does not experience a change in the threshold voltage Vt. This achieves the storing of the data of the volatile memory unit in the nonvolatile memory unit.

During the store operation as described above, the high potential (3.3 V) is never applied to the latch circuit. This is because the NMOS transistors 51 and 52 serve as intervening circuit elements between the plate line PL (Vpp =3.3 V) and the nodes C and /C. Since the word selecting line WLW is set to Vpp/2, and the nodes C and /C are serving as source nodes, the potentials at the nodes C and /C cannot exceed Vpp/2 minus the threshold voltage. In this configuration, therefore, a hot-carrier effect does not happen in the transistors used in the latch circuit. All the MIS transistors used in the memory cell (i.e., the MIS transistors 51 and 52 serving as memory cell transistors and the MIS transistors 54 through 58 constituting the latch circuit) can thus be properly designed to have the same thickness of the gate oxide film.

Figure 10:
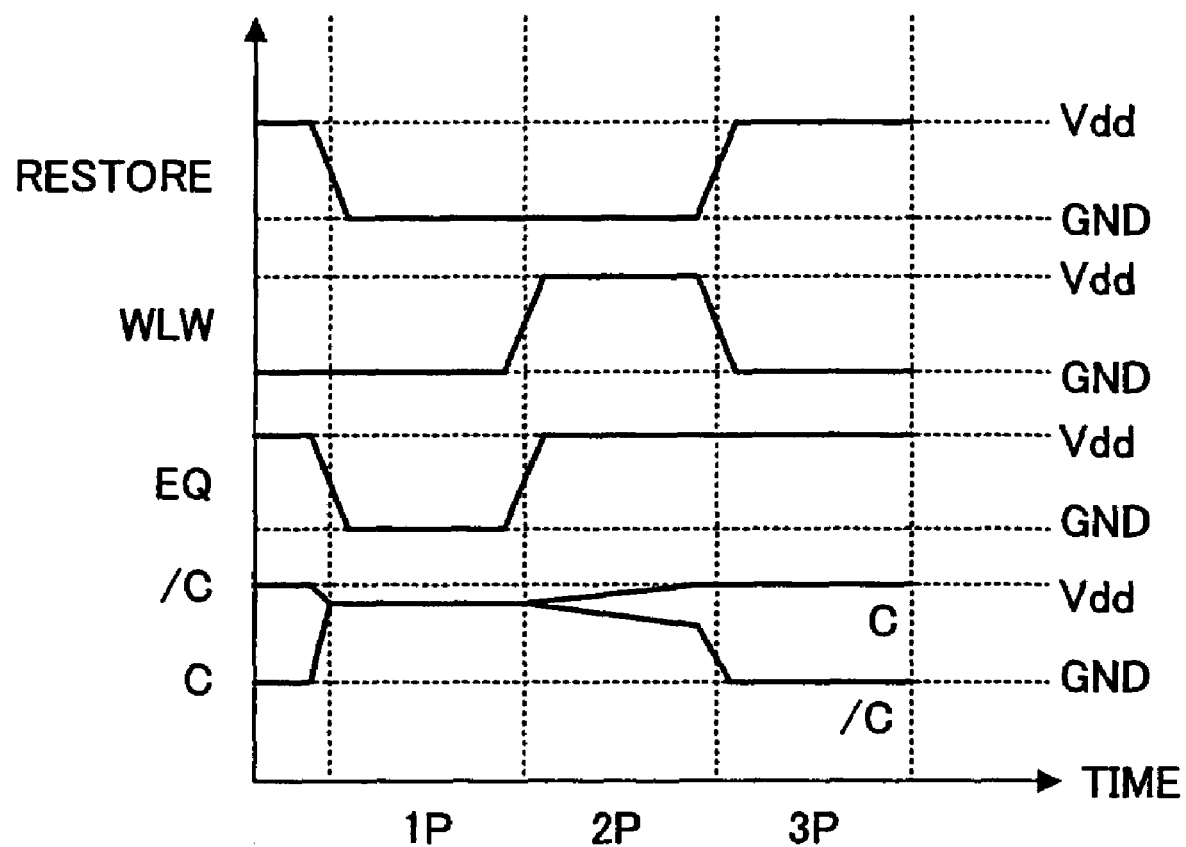
FIG. 10 is a signal waveform diagram for explaining the restore operation of the first embodiment of the nonvolatile memory device according to the present invention.

FIG. 10 is a signal waveform diagram for explaining the restore operation of the first embodiment of the nonvolatile memory device according to the present invention. When the mode input from the exterior of the device indicates a restore operation, the control signals PL, RESTORE, WLW, EQ, WL, and WE are set to 0, 0-0-1, 0-1-0, 0-1-1, 0, and 0, respectively, as shown in FIG. 8. Here, 0-1-0, for example, indicates that the signal level is set to 0 at the first phase, 1 at the second phase, and 0 at the third phase. The first, second, and third phases are shown in FIG. 10 as 1P, 2P, and 3P, respectively.

At the first phase 1P, the signal RESTORE is set to 0, and the signal EQ is set to 0. As a result, the NMOS transistor 54 in FIG. 4 becomes nonconductive to deactivate the volatile memory unit, and the PMOS transistor 53 in FIG. 4 becomes conductive to equalize the nodes C and /C. The equalization of the nodes C and /C is shown in FIG. 10 as occurring at the first phase 1P.

At the second phase 2P, the signal EQ is set to 1, and the word selecting line WLW is set to 1. As a result, the PMOS transistor 53 is turned off to separate the nodes C and /C from each other, and the NMOS transistors 51 and 52 are turned on. Assuming that the store operation as shown in FIG. 9 has been performed prior to the restore operation, the NMOS transistor 51 has a higher threshold voltage, and thus has a higher ON resistance. Accordingly, the force that pulls down the node C is weaker than the force that pulls down the node /C, resulting in the nodes C and /C changing to HIGH and LOW, respectively, as shown at the second phase 2P in FIG. 10.

At the third phase, the signal RESTORE is set to 1, and the word selecting line WLW is set to 0. As a result, the NMOS transistor 54 in FIG. 4 becomes conductive to activate the volatile memory unit, and the NMOS transistors 51 and 52 are turned off. The activated volatile memory unit amplifies a potential difference appearing between the node C and the node /C, thereby sensing (detecting) the data stored in the nonvolatile memory unit. The amplification of the potential difference between the nodes C and /C is shown at the third phase 3P in FIG. 10.

Figure 11:
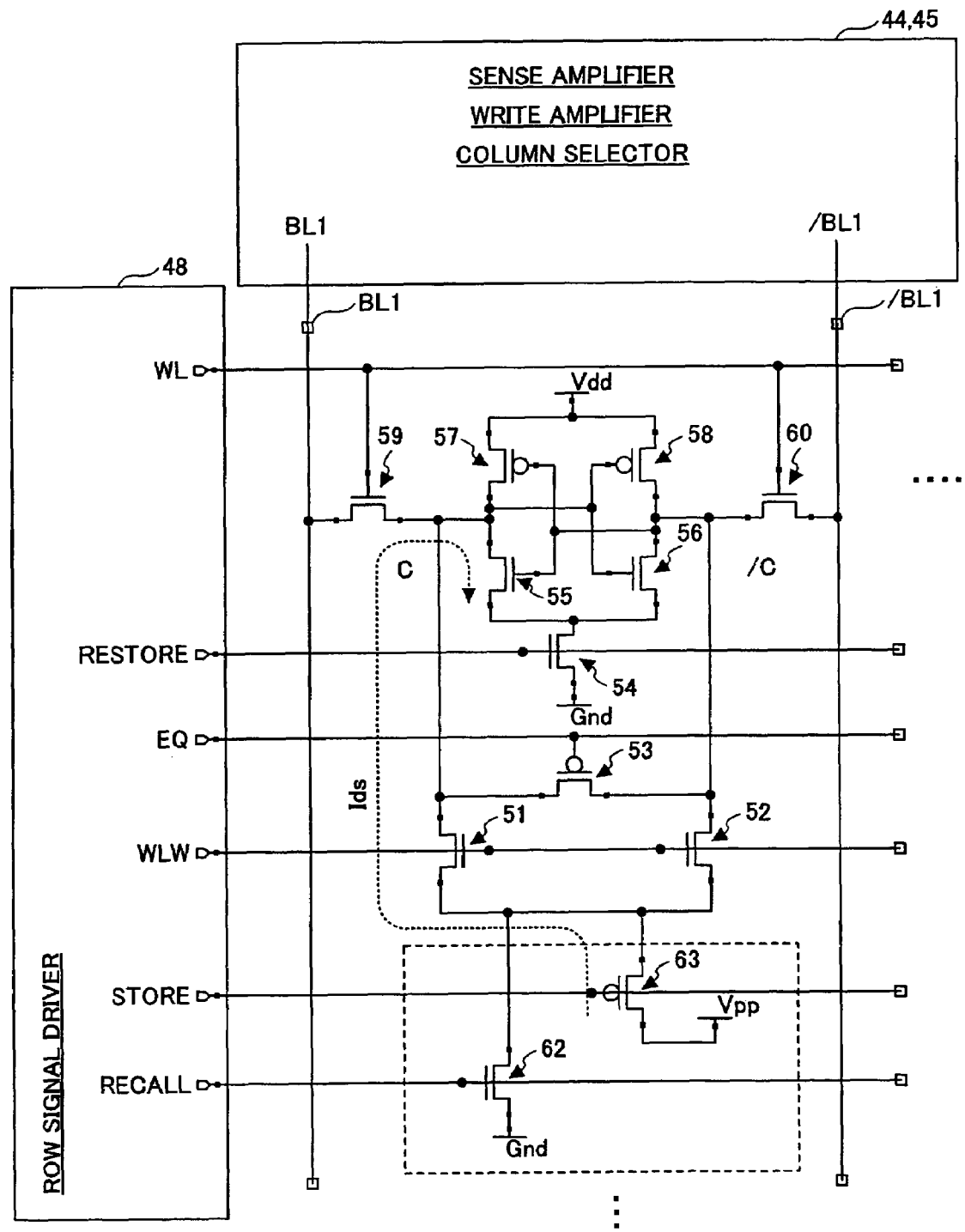
FIG. 11 is an illustrative drawing showing the configuration of a memory cell according to a second embodiment of the nonvolatile memory device of the present invention.

FIG. 11 is an illustrative drawing showing the configuration of a memory cell according to a second embodiment of the nonvolatile memory device of the present invention. The same elements as those of FIG. 4 are referred to by the same numerals, and a description thereof will be omitted unless necessary.

The memory cell includes an NMOS transistor 62 and a PMOS transistor 63, in addition to the NMOS transistors 51 and 52, the PMOS transistor 53, the NMOS transistors 54 through 56, the PMOS transistors 57 and 58, and the NMOS transistors 59 and 60 that are the same transistors as shown in FIG. 4. The NMOS transistor 62 and the PMOS transistor 63 have a thicker gate oxide film than the other transistors, so that they are designed to operate in the 0-to-3.3 voltage range As shown in FIG. 11, there is no plate line PL in the second embodiment. A store line STORE is provided to extend from the row signal driver 48, and is coupled to the gate node of the PMOS transistor 63. A signal line providing a coupling between the drain node of the PMOS transistor 63 and the NMOS transistors 51 and 52 serves as a controlled-power line. Further, a recall line RECALL extends from the row signal driver 48 to be connected to the gate of the NMOS transistor 62. The above-noted controlled-power line is coupled to the drain node of the NMOS transistor 62. The controlled-power line functions similarly to the manner the plate line PL of the first embodiment functions.

Figure 17:
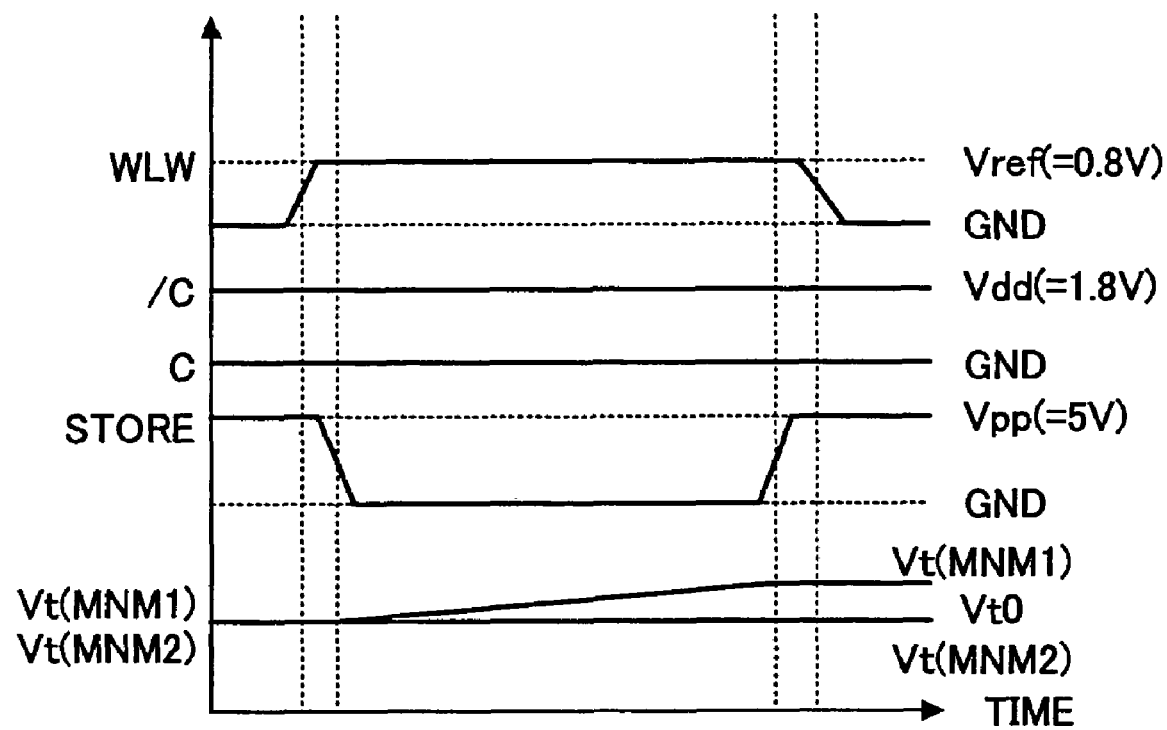
FIG. 17 is a signal waveform diagram for explaining the store operation of the nonvolatile memory device of the second embodiment.

It should be noted that the configuration shown in FIG. 17 is identical with respect to each and every one of the memory cells provided in the memory cell array 49. Namely, multiple sets of the lines WL, RESTORE, EQ, WLW, STORE, and RECALL are provided in one-to-one correspondence to the rows of the memory cell array 49.

Figure 12:
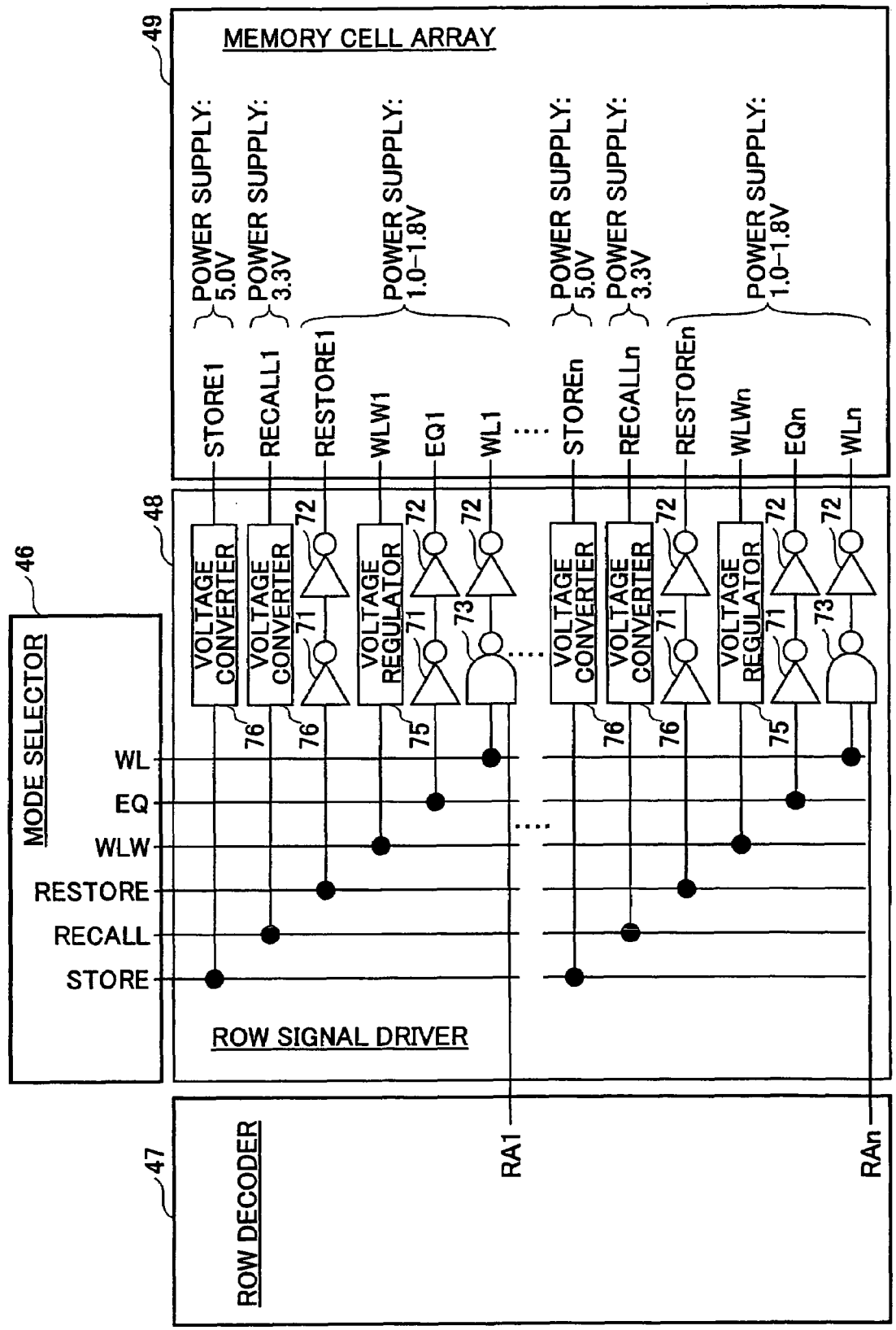
FIG. 12 is a drawing showing multiple sets of lines extending from a row signal driver and their relations with a mode selector and a row decoder according to the second embodiment.

FIG. 12 is a drawing showing the multiple sets of the lines extending from the row signal driver 48 and their relations with the mode selector 46 and the row decoder 47 according to the second embodiment. In FIG. 12, the same elements as those shown in FIG. 5 are referred to by the same numerals, and a description thereof will be omitted as appropriate.

As shown in FIG. 12, the mode selector 46 supplies signals STORE, RECALL, RESTORE, WLW, EQ, and WL to the row signal driver 48. The signals STORE, RECALL, RESTORE, WLW, EQ, and PL are coupled to the corresponding lines of each row without any logic operation, and are thus output from the row signal driver 48 to the memory cell array 49 as STORE1, RECALL1, RESTORE1, WLW1, and EQ1 for a row address RA1 and STOREn, RECALLn, RESTOREn, WLWn, and EQn for a row address RAn, for example. The voltage regulators 75 are used for WLW, and voltage converters 76 are used for STORE and RECALL.

The signal WL supplied from the mode selector 46 and each row address signal are combined by a corresponding NAND gate 73, an output of which is inverted by the inverter 72 for provision to the memory cell array 49. Thus, only one of the signals WL1 through WLn is activated and supplied to the memory cell array 49 so as to activate a selected row address.

Figure 13:
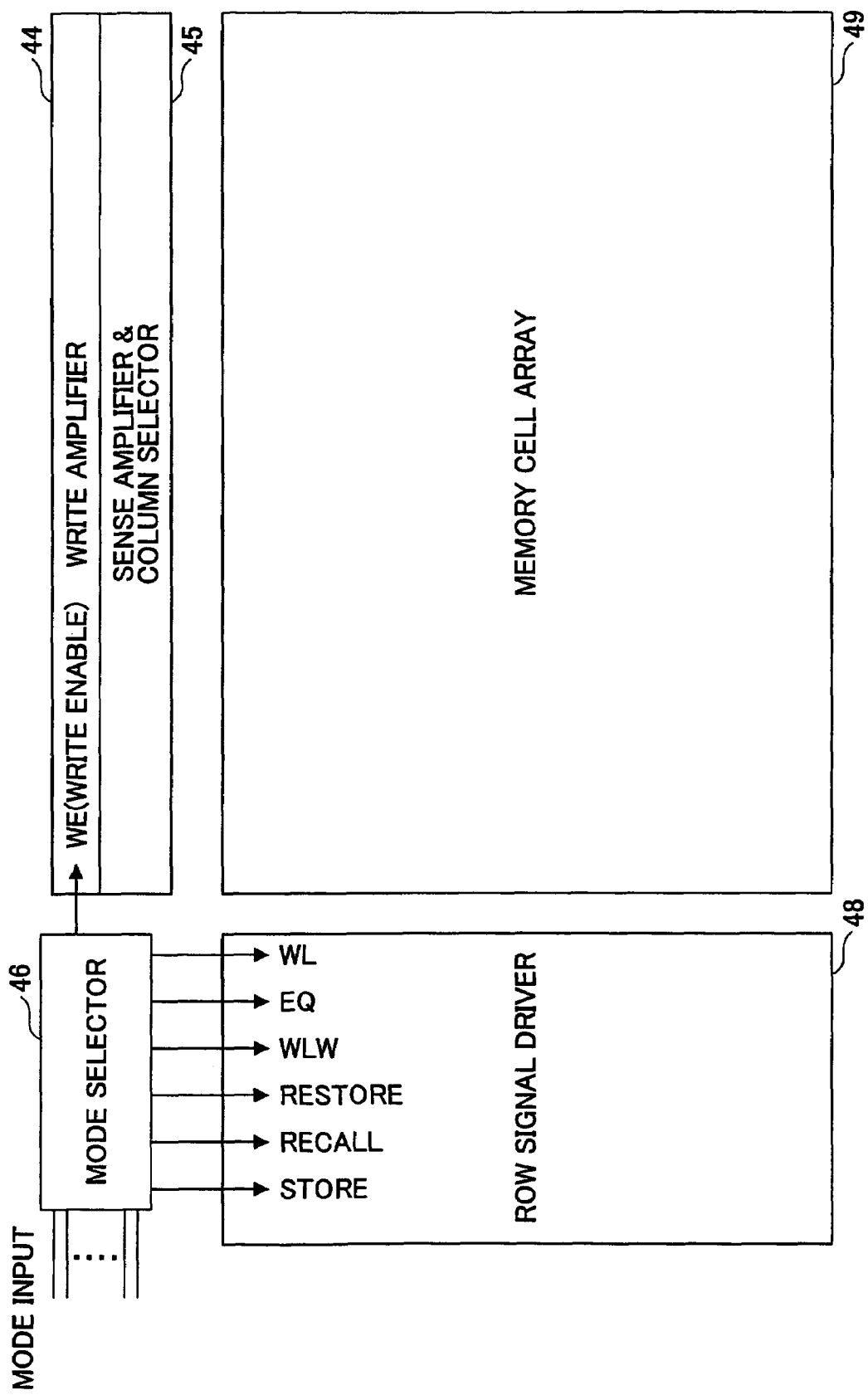
FIG. 13 is a drawing showing the flow of control signals output from the mode selector.

FIG. 13 is a drawing showing the flow of control signals output from the mode selector 46. As shown in FIG. 13, the mode selector 46 receives and decodes the mode input signals, and supplies various control signals to the row signal driver 48 and the write amplifier 44. Specifically, the control signals STORE, RECALL, RESTORE, WLW, EQ, and WL are supplied to the row signal driver 48, and a write enable signal WE is supplied to the write amplifier 44.

Figure 14:
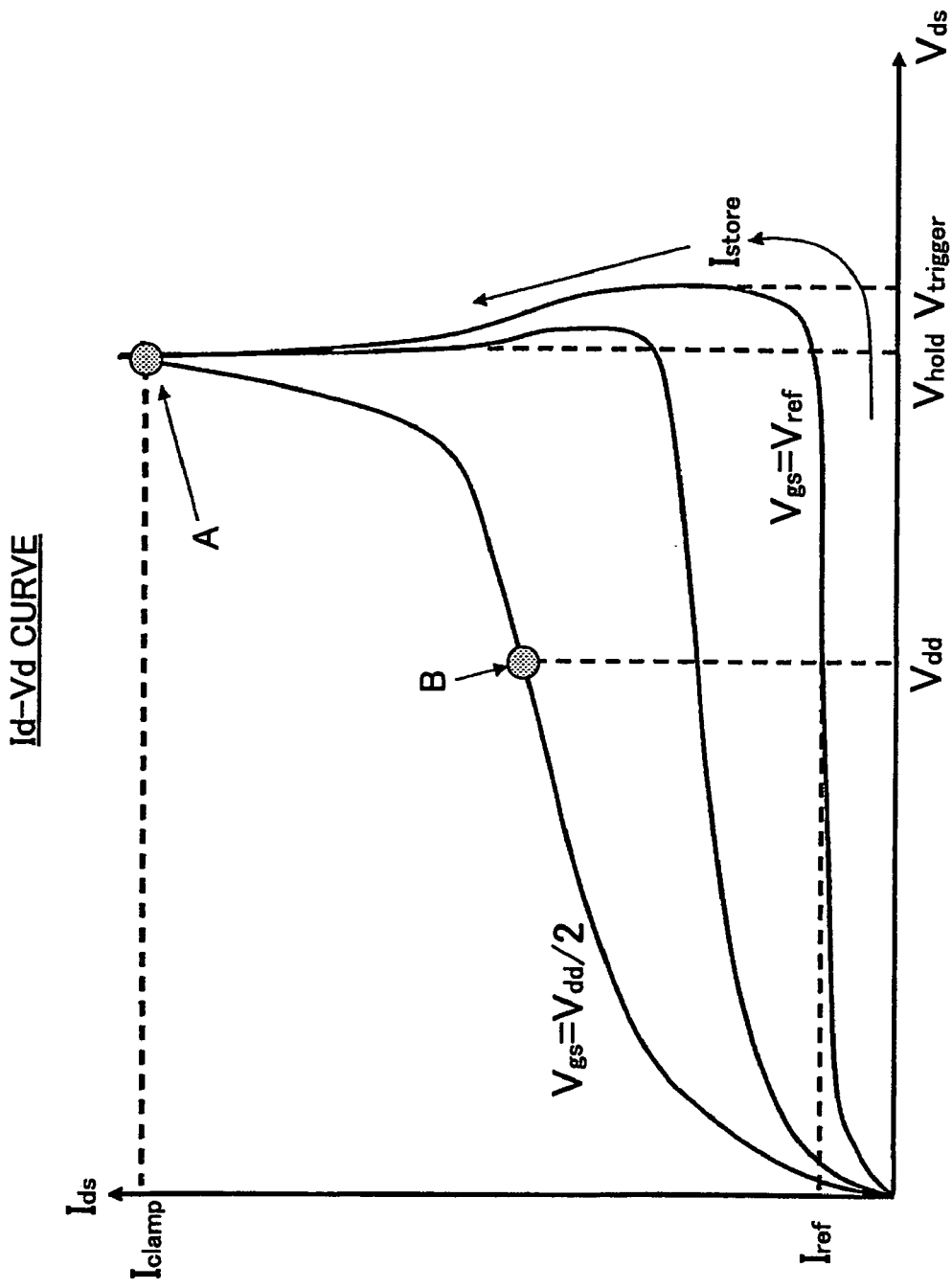
FIG. 14 is a graph chart showing a snapback phenomenon.

FIG. 14 is a graph chart showing a phenomenon called a "snapback". In the second embodiment of the nonvolatile semiconductor memory device, a snapback phenomenon is used to achieve an even stronger hot-carrier effect.

In FIG. 14, the horizontal axis represents the drain-source voltage Vds, and the vertical axis represents the drain-source current Ids. When Vds is equal to Vdd, the gate-source voltage Vgs that achieves the maximum hot-carrier injection is Vdd/2. This condition is indicated by the position of a point B in the graph chart. When the gate-source voltage Vgs is Vdd/2, an increase in the drain-source voltage Vds results in an ordinary increase in the drain-source current Ids, which is shown by the characteristic curve crossing the point B.

Under certain gate-source bias conditions, an increase in the drain-source voltage Vds may not results in an ordinary increase in the drain-source current Ids, but may create a sudden increase that results in a surge of a large amount of current. This behavior of current is shown by the characteristic curve denoted as "istore". Such current surge is referred to as a snapback phenomenon.

For snapback to occur, the gate-source voltage Vgs is set to Vref such that the drain-source current is set to an appropriate current amount Iref. It is preferable that the transistor channel is placed in a slightly reversed state when the gate-source voltage Vgs is Vref. Vref may thus be preferably from Vt+0.1V to Vt+0.3V, for example, to cause snapback and thus a strong hot-carrier effect.

With Vref being applied across the gate and source, the drain-source current Vds is gradually increased. When Vds exceeds the upper limit of the normal operating range to reach a trigger voltage Vtrigger, electron-hole pairs are generated in a chain-reaction manner, resulting in a sudden increase in the drain current. In the region where Vgs is low, Vds-Ids is known to exhibit a negative resistance characteristic. As the drain-source voltage Vds is gradually lowered after this, the chain-reaction ceases to exist at the point where Vds is equal to a certain voltage Vhold. This condition is shown by the position of a point A. At the point A, ordinary Ids-Vds characteristics are observed.

In the circuit shown in FIG. 11, a current Ids running from Vpp through the PMOS transistor 63 and the NMOS transistor 51 toward to the ground voltage is controlled to behave in the snapback mode as described above (like Istore in FIG. 14). With this provision, an even stronger hot-carrier effect compared with the first embodiment can be created in the NMOS transistor 51 (or 52). It should be noted that when snapback occurs, the amount of the current Ids running through the NMOS transistor 51 (or 52) is limited to Iclamp (see FIG. 14), which is determined by the conductance of the PMOS transistor 63. Further, Vpp coupled to the source node of the PMOS transistor 63 in this example may be set to 5 V. This voltage is selected to cause the snapback phenomenon.

Figure 15:
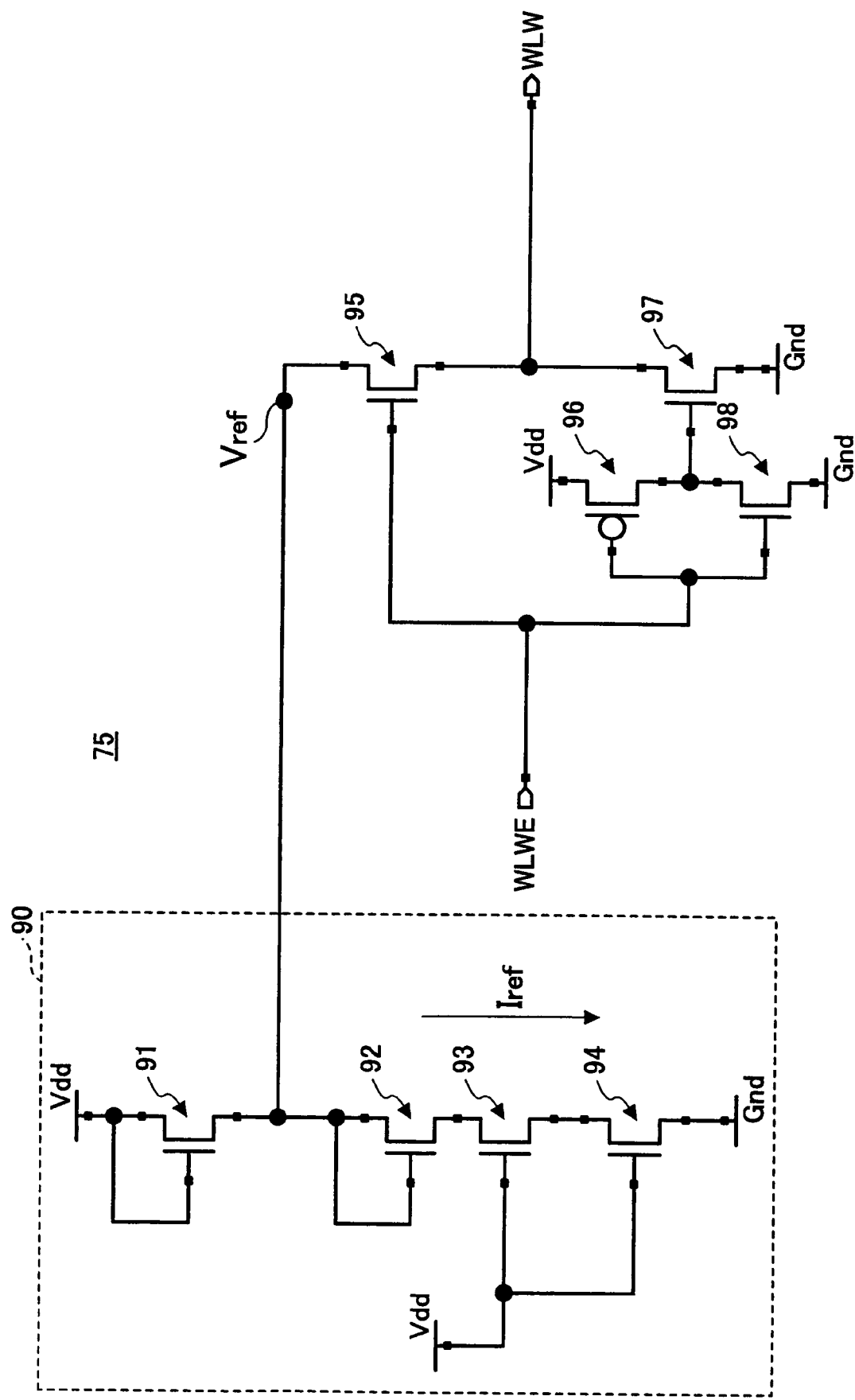
FIG. 15 is a circuit diagram showing the configuration of a voltage regulator.

FIG. 15 is a circuit diagram showing the configuration of a voltage regulator 75.

The voltage regulator 75 shown in FIG. 15 includes NMOS transistors 91 through 95, a PMOS transistor 96, and NMOS transistors 97 and 98. The NMOS transistors 91 through 95 together form a reference voltage generating circuit 90.

The reference voltage generating circuit 90 generates a reference voltage Vref from the power supply voltage Vdd. The reference voltage Vref is applied to the word selecting line WLW via the NMOS transistor 95 when the NMOS transistor 95 is made conductive. A signal WLWE, which may be the signal WLW shown in FIG. 12, controls the on/off state of the NMOS transistor 95.

The NMOS transistor 92 has the same shape and same size as the NMOS transistors 51 and 52 (see FIG. 11). The NMOS transistor 93 has the same shape and same size as the NMOS transistors 55 and 56. The NMOS transistor 94 has the same shape and same size as the NMOS transistor 54. This provision makes it possible that the current Ids running through the NMOS transistor 51 (or 52) is set equal to the current Iref flowing through the NMOS transistor 92 of the reference voltage generating circuit 90. The amount of the current Iref may properly be adjusted by controlling the size of the NMOS transistor 91.

FIG. 16 is a table chart showing the signal levels of the control signals that are defined with respect to each operation. The columns of the table correspond to the respective control signals RESTORE, STORE, RECALL, WLW, EQ, WL, and WE, which are generated by the mode selector 46 in response to the mode input signals supplied from an exterior of the device. The rows of the table correspond to respective operations "Write", "Read", "Store", "Restore", and "Standby".

The mode selector 46 sets the control signals to signal levels (signal states) as shown in the table of FIG. 16 in response to the mode input signals. Through such settings of the control signals, the mode selector 46 controls the write amplifier 44 and the row signal driver 48 to perform a requested operation with respect to the memory cell array 49.

FIG. 17 is a signal waveform diagram for explaining the store operation of the nonvolatile memory device of the second embodiment. When the mode input from the exterior of the device indicates a store operation, the control signals RESTORE, STORE, RECALL, WLW, EQ, WL, and WE are set to 1, 0, 0, 1, 1, 0, and 0, respectively, as shown in FIG. 16. In response to STORE being 0, the signal line STORE is set to GND (=0 V), and in response to WLW being 1, the word selecting line WLW is set to Vref (=0.8 V), as shown in FIG. 17.

In an example shown in FIG. 17, the node /C is HIGH (Vdd=1.8 V), and the node C is LOW (GND: ground). As a result, only the NMOS transistor 51 (denoted as MNM1 in FIG. 17) experiences a rise in the threshold voltage Vt. The NMOS transistor 52 (denoted as MNM2 in FIG. 17) does not experience a change in the threshold voltage Vt. This achieves the storing of the data of the volatile memory unit in the nonvolatile memory unit.

During the store operation as described above, a potential (5 V) hither than the trigger voltage Vtrigger is applied to the NMOS transistor 51. With the gate of the NMOS transistor 51 being set to Vref, the NMOS transistor 51 experiences a snapback phenomenon, resulting in the occurrence of a strong hot-carrier effect.

Figure 18:
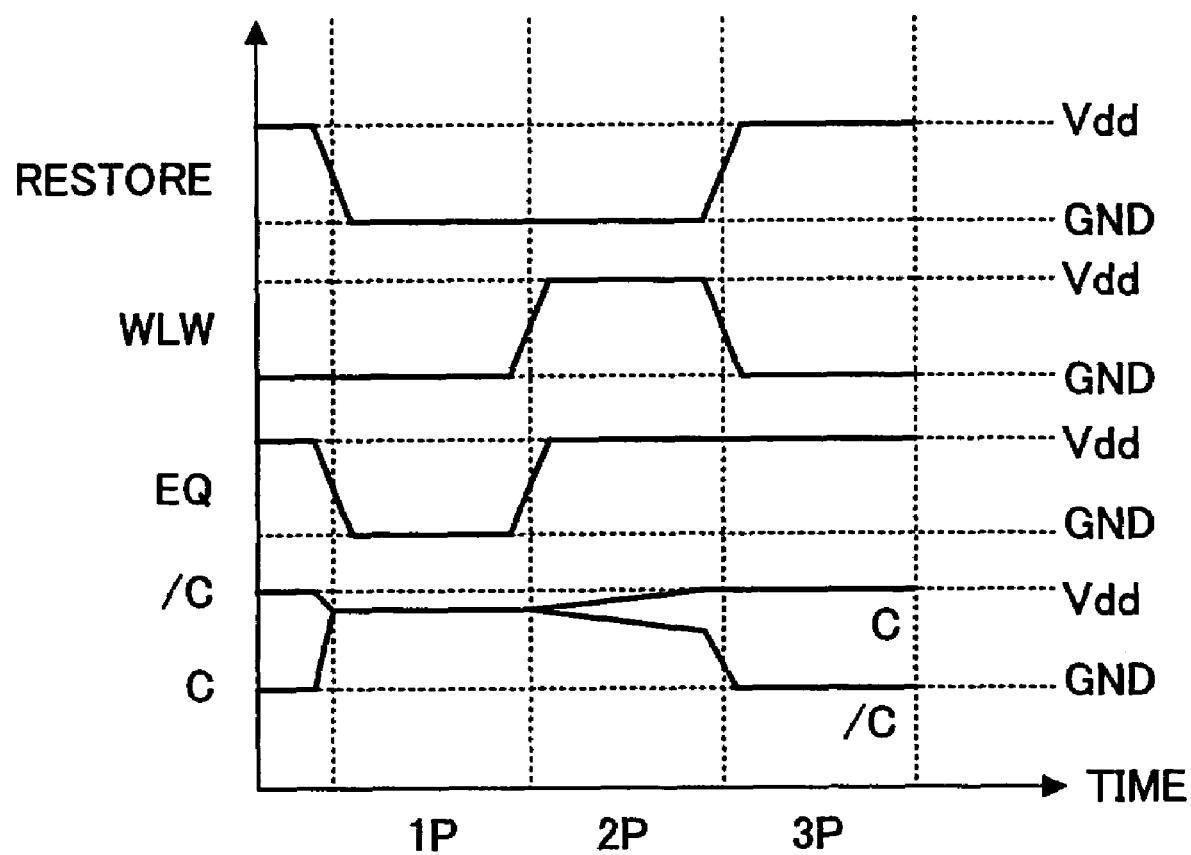
FIG. 18 is a signal waveform diagram for explaining the restore operation of the second embodiment of the nonvolatile memory device according to the present invention.

FIG. 18 is a signal waveform diagram for explaining the restore operation of the second embodiment of the nonvolatile memory device according to the present invention. When the mode input from the exterior of the device indicates a restore operation, the control signals RESTORE, STORE, RECALL, WLW, EQ, WL, and WE are set to 0-0-1, 1, 1, 0-1-0, 0-1-1, 0, and 0, respectively, as shown in FIG. 16. In response to RECALL being 1, the NMOS transistor 62 shown in FIG. 11 becomes conductive.

At the first phase 1P, the signal RESTORE is set to 0, and the signal EQ is set to 0. As a result, the NMOS transistor 54 in FIG. 11 becomes nonconductive to deactivate the volatile memory unit, and the PMOS transistor 53 in FIG. 11 becomes conductive to equalize the nodes C and /C. The equalization of the nodes C and /C is shown in FIG. 18 as occurring at the first phase 1P.

At the second phase 2P, the signal EQ is set to 1, and the word selecting line WLW is set to 1. As a result, the PMOS transistor 53 is turned off to separate the nodes C and /C from each other, and the NMOS transistors 51 and 52 are turned on. Assuming that the store operation as shown in FIG. 17 has been performed prior to the restore operation, the NMOS transistor 51 has a higher threshold voltage, and thus has a higher ON resistance. Accordingly, the force that pulls down the node C to the ground potential through the NMOS transistor 62 is weaker than the force that pulls down the node /C, resulting in the nodes C and /C changing to HIGH and LOW, respectively, as shown at the second phase 2P in FIG. 18.

At the third phase, the signal RESTORE is set to 1, and the word selecting line WLW is set to 0. As a result, the NMOS transistor 54 in FIG. 11 becomes conductive to activate the volatile memory unit, and the NMOS transistors 51 and 52 are turned off. The activated volatile memory unit amplifies a potential difference appearing between the node C and the node /C, thereby sensing (detecting) the data stored in the nonvolatile memory unit. The amplification of the potential difference between the nodes C and /C is shown at the third phase 3P in FIG. 18.

Figure 19:
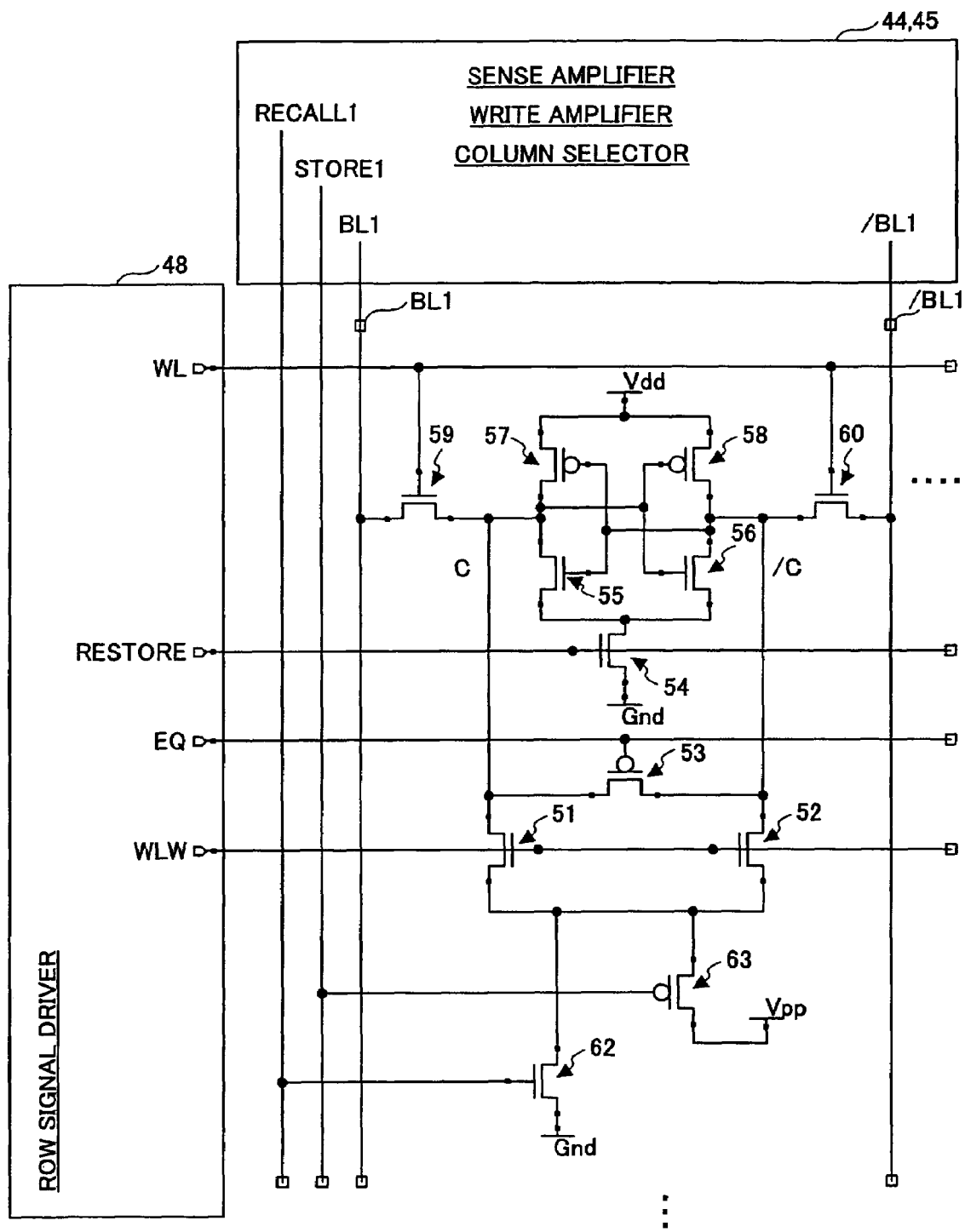
FIG. 19 is an illustrative drawing showing the configuration of a memory cell according to a third embodiment of the nonvolatile memory device of the present invention.

FIG. 19 is an illustrative drawing showing the configuration of a memory cell according to a third embodiment of the nonvolatile memory device of the present invention. The same elements as those of FIG. 11 are referred to by the same numerals, and a description thereof will be omitted unless necessary.

The configuration shown in FIG. 19 differs from that of FIG. 11 only in that the signal line RECALL and the store line STORE extend in a direction perpendicular to the word selecting line WLW. In FIG. 19, the signal line that is coupled to the gate of the NMOS transistor 62 is denoted as RECALL1, and the signal line that is coupled to the gate of the PMOS transistor 63 is denoted as STORE1.

This configuration makes it possible to select a single memory cell for the store operation and the restore operation by achieving a row selection by WLW and a column selection by RECALL and STORE. Namely, a bit-by-bit store operation as well as a bit-by-bit restore operation can be performed.

Figure 20:
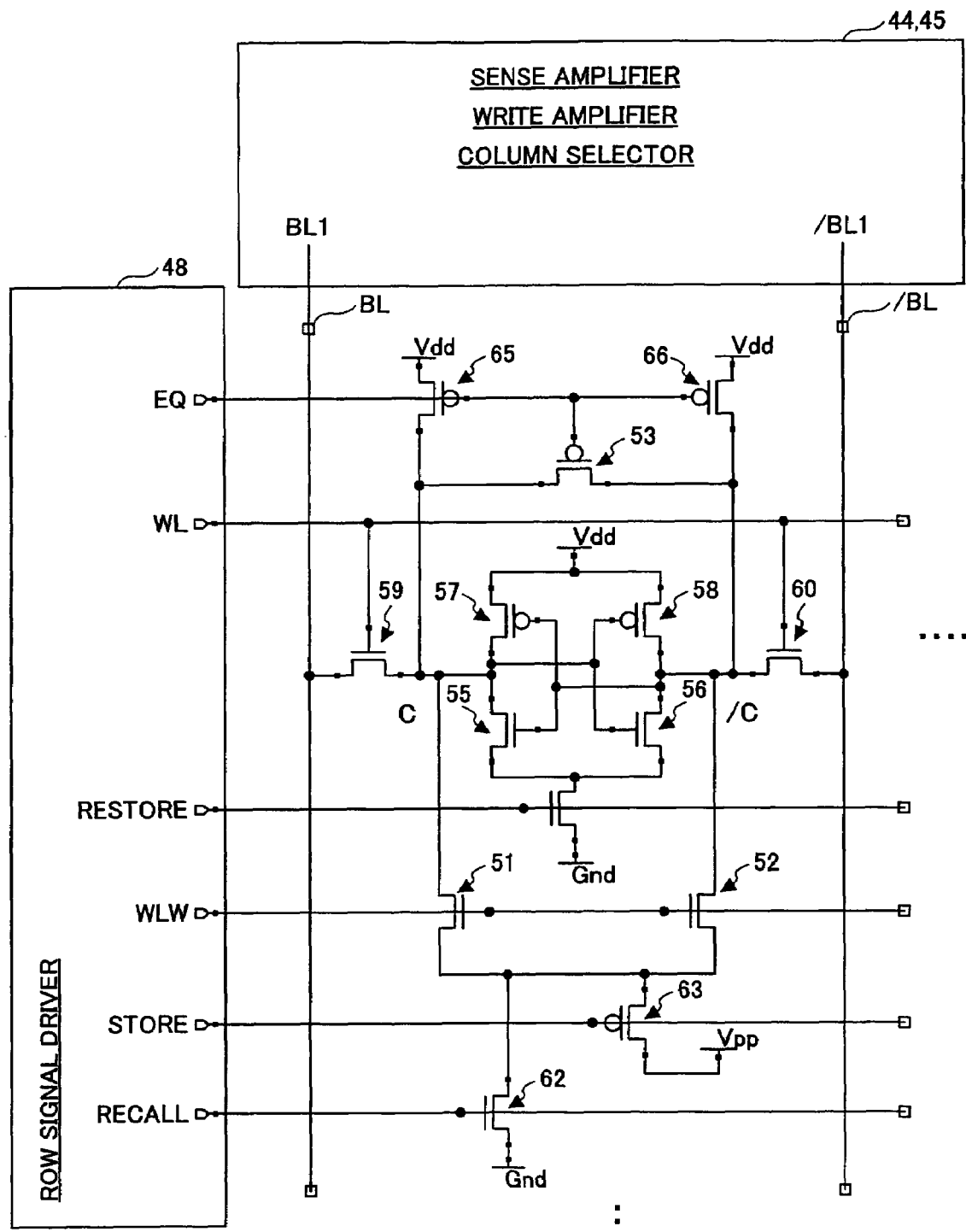
FIG. 20 is an illustrative drawing showing the configuration of a memory cell according to a fourth embodiment of the nonvolatile memory device of the present invention.

FIG. 20 is an illustrative drawing showing the configuration of a memory cell according to a fourth embodiment of the nonvolatile memory device of the present invention. The same elements as those of FIG. 11 are referred to by the same numerals, and a description thereof will be omitted unless necessary.

In FIG. 20, PMOS transistors 65 and 66 are additionally provided on top of the configuration shown in FIG. 11. The gates of the PMOS transistors 65 and 66 are coupled to the equalize line EQ.

Figure 21:
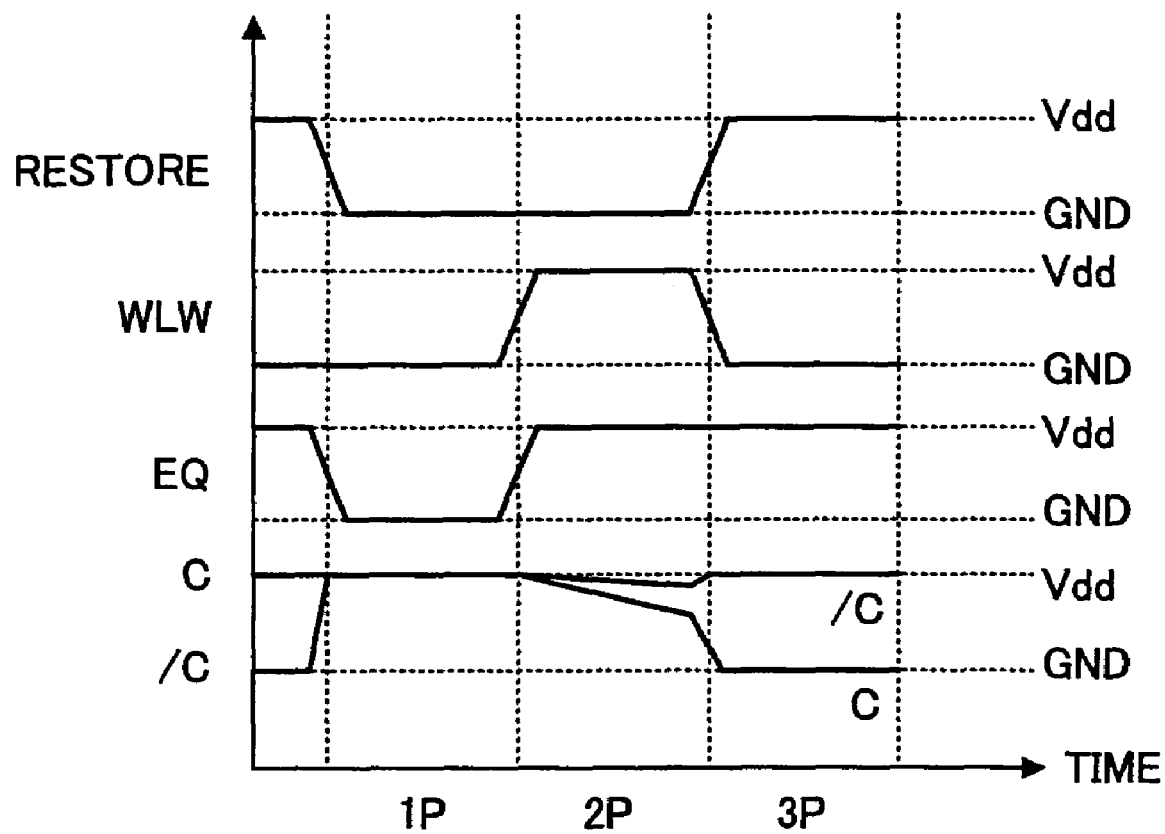
FIG. 21 is a signal waveform diagram for explaining the restore operation of the fourth embodiment of the nonvolatile memory device according to the present invention.

FIG. 21 is a signal waveform diagram for explaining the restore operation of the fourth embodiment of the nonvolatile memory device according to the present invention. When the equalize line EQ is set to LOW during the first phase of the restore operation, the PMOS transistors 65 and 66 become conductive so as to set the nodes C and /C to the power supply voltage Vdd. At the same time, the PMOS transistor 53 becomes conductive to equalize the nodes C and /C.

Without the PMOS transistors 65 and 66 as is the case in the configuration of FIG. 11, the nodes C and /C following the equalization is not specifically set to any potential, and is thus strongly susceptible to noise. With the PMOS transistors 65 and 66 in place as in the configuration shown in FIG. 20, the nodes C and /C are specifically set to the power supply voltage Vdd. This makes the restore operation less susceptible to noise.

Further, the present invention is not limited to these embodiments, but various variations and modifications may be made without departing from the scope of the present invention.

What is claimed is:

1. A memory circuit, comprising:
   a latch including MIS transistors, said latch having a first node and a second node configured to be bi-stable with a potential of the first node inverse to a potential of the second node;
   a plate line;
   a word selecting line;
   a first MIS transistor having one of source/drain nodes thereof coupled to the first node of said latch, another one of the source/drain nodes thereof coupled to said plate line, and a gate node thereof coupled to said word selecting line;
   a second MIS transistor having one of source/drain nodes thereof coupled to the second node of said latch, another one of the source/drain nodes thereof coupled to said plate line, and a gate node thereof coupled to said word selecting line; and
   a driver circuit configured to set said plate line to a first potential causing the first node to serve as a source node of said first MIS transistor in a first operation mode and to a second potential causing the first node to serve as a drain node of said first MIS transistor in a second operation mode, said first operation mode causing a lingering change in characteristics of said first MIS transistor.

2. The memory circuit as claimed in claim 1, wherein all of said MIS transistors, said first MIS transistor, and said second MIS transistor have a substantially identical thickness of a gate insulating film.

3. The memory circuit as claimed in claim 1, wherein said second operation mode causes said latch to store data responsive to the lingering change in the characteristics of said first MIS transistor.

4. The memory circuit as claimed in claim 1, wherein said first node is at a third potential, and said second node is at a fourth potential, said fourth potential being situated between said first potential and the third potential in the first operation mode.

5. The memory circuit as claimed in claim 4, wherein said driver circuit sets, in the first operation mode, said word selecting line to a potential that is situated at a midpoint between the first potential and the third potential.

6. The memory circuit as claimed in claim 5, wherein the first potential is outside a normal operating range of said first MIS transistor.

7. The memory circuit as claimed in claim 1, wherein said driver circuit is configured to deactivate said latch such as to set the first node and second node to a common potential at a first stage of the second operation mode, and is configured to activate said latch and set said plate line to the second potential at a second stage of the second operation mode, thereby causing said latch to store data responsive to the lingering change in the characteristics of said first MIS transistor.

8. A semiconductor memory device, comprising:
   a control circuit;
   word lines extending from said control circuit;
   controlled-power lines controlled by said control circuit;
   word selecting lines extending from said control circuit; and
   a plurality of memory units arranged in a matrix, one of said memory units coupled to a first bit line and a second bit line, said one of said memory units including:
   a latch including MIS transistors, said latch having a first node and a second node configured to be bi-stable with a potential of the first node inverse to a potential of the second node;
   a first MIS transistor having having one of source/drain nodes thereof coupled to the first node of said latch, another one of the source/drain nodes thereof coupled to one of said controlled-power lines, and a gate node thereof coupled to one of said word selecting lines;

a second MIS transistor having one of source/drain nodes thereof coupled to the second node of said latch, another one of the source/drain nodes thereof coupled to said one of said controlled-power lines, and a gate node thereof coupled to said one of said word selecting lines;

a third transistor having a gate thereof coupled to one of said word lines and source/drain nodes thereof coupled to the first node and the first bit line, respectively; and a fourth transistor having a gate thereof coupled to said one of said word lines and source/drain nodes thereof coupled to the second node and the second bit line, respectively, wherein said control circuit is configured to set said one of said controlled-power lines to a first potential causing the first node to serve as a source node of said first MIS transistor in a first operation mode and to a second potential causing the first node to serve as a drain node of said first MIS transistor in a second operation mode, said first operation mode causing a lingering change in characteristics of said first MIS transistor.

9. The semiconductor memory device as claimed in claim 8, wherein all of said MIS transistors, said first MIS transistor, and said second MIS transistor have a substantially identical thickness of a gate insulating film.

10. The semiconductor memory device as claimed in claim 8, wherein said second operation mode causes said latch to store data responsive to the lingering change in the characteristics of said first MIS transistor.

11. The semiconductor memory device as claimed in claim 8, wherein said first node is at a third potential, and said second node is at a fourth potential, said fourth potential being situated between said first potential and the third potential in the first operation mode.

12. The semiconductor memory device as claimed in claim 11, wherein said control circuit sets, in the first operation mode, said one of said word selecting line to a potential that is situated at a midpoint between the first potential and the third potential.

13. The semiconductor memory device as claimed in claim 8, wherein the first potential is such a potential as to cause a snapback phenomenon in said first MIS transistor.

14. The semiconductor memory device as claimed in claim 13, wherein said one of said memory units includes:

an N-channel-type transistor having a gate thereof coupled to said control circuit, a drain node thereof coupled to said one of said controlled-power lines, and a source node thereof coupled to a first power supply node; and a P-channel-type transistor having a gate thereof coupled to said control circuit, a drain node thereof coupled to said one of said controlled-power lines, and a source node thereof coupled to a second power supply node.

15. The semiconductor memory device as claimed in claim 8, further comprising signal lines extending in a direction substantially perpendicular to a direction in which said word selecting lines extend, wherein one of said word selecting lines is coupled to the memory units arranged on a same row, and one of said signal lines is coupled to the memory units arranged on a same column to control a potential of the controlled-power lines.

16. The semiconductor memory device as claimed in claim 8, wherein said one of said memory units further includes:

a MIS transistor having drain/source nodes thereof coupled to the first node and to the second node, respectively;

a MIS transistor having drain/source nodes thereof coupled to the first node and to a power-supply supply node, respectively; and a MIS transistor having drain/source nodes thereof coupled to the second node and to the power-supply node, respectively.

* * * * *